(12) United States Patent
Liang et al.

(10) Patent No.: US 12,046,591 B2
(45) Date of Patent: Jul. 23, 2024

(54) LIGHT-EMITTING SUBSTRATE, METHOD OF MANUFACTURING LIGHT-EMITTING SUBSTRATE, AND DISPLAY DEVICE

(71) Applicant: BOE Technology Group Co., Ltd., Beijing (CN)

(72) Inventors: Xuan Liang, Beijing (CN); Meili Wang, Beijing (CN); Fei Wang, Beijing (CN); Xue Dong, Beijing (CN); Qi Qi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 403 days.

(21) Appl. No.: 17/434,835

(22) PCT Filed: Apr. 8, 2021

(86) PCT No.: PCT/CN2021/085977
§ 371 (c)(1),
(2) Date: Aug. 30, 2021

(87) PCT Pub. No.: WO2021/227717
PCT Pub. Date: Nov. 18, 2021

(65) Prior Publication Data
US 2022/0320056 A1 Oct. 6, 2022

(30) Foreign Application Priority Data
May 11, 2020 (CN) .......................... 202010395225.7

(51) Int. Cl.
*H01L 23/00* (2006.01)
*H01L 25/16* (2023.01)
(52) U.S. Cl.
CPC ............ *H01L 25/167* (2013.01); *H01L 24/45* (2013.01); *H01L 24/48* (2013.01); *H01L 24/85* (2013.01);
(Continued)

(58) Field of Classification Search
CPC ....... H01L 25/167; H01L 24/45; H01L 24/48; H01L 24/85; H01L 24/05; H01L 24/06;
(Continued)

(56) References Cited

U.S. PATENT DOCUMENTS 9,769,919 B2 9/2017 Park et al.
10,153,457 B2 12/2018 Son et al.
(Continued)

FOREIGN PATENT DOCUMENTS

CN 103842898 A 6/2014
CN 104347678 A 2/2015
(Continued)

OTHER PUBLICATIONS

Office Action dated Dec. 26, 2022, issued in counterpart CN application No. 202010395225.7, with English translation. (13 pages).
(Continued)

*Primary Examiner* — Elias Ullah
(74) *Attorney, Agent, or Firm* — WHDA, LLP

(57) ABSTRACT

A light-emitting substrate, a method of manufacturing a light-emitting substrate, and a display device are provided. The light-emitting substrate includes: a first substrate, wherein the first substrate includes a first base substrate, a light-emitting diode arranged on the first base substrate, and a first conductive pad arranged on the first base substrate; a second substrate arranged opposite to the first substrate, wherein the second substrate includes a second base substrate, and a second conductive pad arranged on the second base substrate; and a bonding wire structure including a bonding wire, wherein the first conductive pad is located on a surface of the first substrate away from the second substrate, the second conductive pad is located on a surface of the second substrate away from the first substrate, and the
(Continued)

bonding wire is configured to electrically connect the first conductive pad and the second conductive pad.

22 Claims, 18 Drawing Sheets

(52) U.S. Cl.
CPC .............. *H01L 24/05* (2013.01); *H01L 24/06* (2013.01); *H01L 24/46* (2013.01); *H01L 2224/04042* (2013.01); *H01L 2224/05573* (2013.01); *H01L 2224/05639* (2013.01); *H01L 2224/05644* (2013.01); *H01L 2224/05647* (2013.01); *H01L 2224/0568* (2013.01); *H01L 2224/0603* (2013.01); *H01L 2224/08145* (2013.01); *H01L 2224/45015* (2013.01); *H01L 2224/45124* (2013.01); *H01L 2224/45139* (2013.01); *H01L 2224/45144* (2013.01); *H01L 2224/45147* (2013.01); *H01L 2224/48106* (2013.01); *H01L 2224/48141* (2013.01); *H01L 2224/48992* (2013.01); *H01L 2224/85007* (2013.01); *H01L 2924/0132* (2013.01); *H01L 2924/12041* (2013.01)

(58) Field of Classification Search
CPC ........... H01L 24/46; H01L 2224/04042; H01L 2224/05573; H01L 2224/05639; H01L 2224/05644; H01L 2224/05647; H01L 2224/0568; H01L 2224/0603; H01L 2224/08145; H01L 2224/45015; H01L 2224/45124; H01L 2224/45139; H01L 2224/45144; H01L 2224/45147; H01L 2224/48106; H01L 2224/48141; H01L 2224/48992; H01L 2224/85007; H01L 2924/0132; H01L 2924/12041; H01L 33/486; H01L 2933/0033; H01L 2933/0066; H01L 25/0753; H01L 33/62; H01L 27/156; H01L 27/124; H01L 24/97; H01L 27/1218; H01L 27/1262
See application file for complete search history.

(56) References Cited

U.S. PATENT DOCUMENTS

| | | | |
|---|---|---|---|
| 10,261,370 B2 | 4/2019 | Drzaic et al. | |
| 10,342,120 B2 | 7/2019 | Park et al. | |
| 10,374,194 B2 | 8/2019 | Son et al. | |
| 10,555,414 B2 | 2/2020 | Park et al. | |
| 10,620,490 B2 | 4/2020 | Drzaic et al. | |
| 10,637,007 B1 | 4/2020 | Wang et al. | |
| 10,869,388 B2 | 12/2020 | Park et al. | |
| 10,877,332 B2 | 12/2020 | Drzaic et al. | |
| 11,108,021 B2 | 8/2021 | Zhai et al. | |
| 11,137,648 B2 | 10/2021 | Drzaic et al. | |
| 11,304,294 B2 | 4/2022 | Park et al. | |
| 11,393,804 B2 | 7/2022 | Lee et al. | |
| 2013/0088671 A1 | 4/2013 | Drzaic et al. | |
| 2014/0063393 A1 | 3/2014 | Zhong et al. | |
| 2015/0036300 A1 | 2/2015 | Park et al. | |
| 2017/0047547 A1 | 2/2017 | Son et al. | |
| 2017/0359890 A1 | 12/2017 | Park et al. | |
| 2017/0367173 A1 | 12/2017 | Park et al. | |
| 2018/0114944 A1 | 4/2018 | Son et al. | |
| 2019/0036075 A1* | 1/2019 | Jiang | H10K 77/111 |
| 2019/0212603 A1 | 7/2019 | Drzaic et al. | |
| 2019/0230783 A1 | 7/2019 | Park et al. | |
| 2020/0051966 A1 | 2/2020 | Lee et al. | |
| 2020/0201102 A1 | 6/2020 | Drzaic et al. | |
| 2021/0063804 A1 | 3/2021 | Drzaic et al. | |
| 2021/0068246 A1 | 3/2021 | Park et al. | |
| 2021/0193959 A1 | 6/2021 | Zhai et al. | |
| 2021/0296394 A1 | 9/2021 | Meng et al. | |
| 2021/0399185 A1 | 12/2021 | Liu et al. | |
| 2022/0310579 A1 | 9/2022 | Lee et al. | |

FOREIGN PATENT DOCUMENTS

| | | |
|---|---|---|
| CN | 106972045 A | 7/2017 |
| CN | 108054189 A | 5/2018 |
| CN | 108281387 A | 7/2018 |
| CN | 109962095 A | 7/2019 |
| CN | 110164901 A | 8/2019 |
| CN | 110211973 A | 9/2019 |
| CN | 110503898 A | 11/2019 |
| CN | 110649039 A | 1/2020 |
| CN | 110828511 A | 2/2020 |
| EP | 0609074 A2 | 8/1994 |
| EP | 1006505 A2 | 6/2000 |
| JP | H04-304427 A | 10/1992 |

OTHER PUBLICATIONS

International Search Report dated Jul. 7, 2021, issued in counterpart Application No. PCT/CN2021/085977.
Office Action dated May 25, 2023, issued in counterpart CN application No. 202010395225.7. (8 pages).
Extended (Supplementary) European Search Report dated May 9, 2023, issued in counterpart EP application No. 21804562.3. (9 pages).

* cited by examiner

LIGHT-EMITTING SUBSTRATE, METHOD OF MANUFACTURING LIGHT-EMITTING SUBSTRATE, AND DISPLAY DEVICE

CROSS REFERENCE TO RELATED APPLICATION(S)

The present disclosure is a Section 371 National Stage Application of International Application No. PCT/CN2021/085977, filed on Apr. 8, 2021, entitled "LIGHT-EMITTING SUBSTRATE, METHOD OF MANUFACTURING LIGHT-EMITTING SUBSTRATE, AND DISPLAY DEVICE", and the PCT Application claims priority to the Chinese Patent Application No. 202010395225.7 filed on May 11, 2020, which are incorporated herein by reference in their entireties.

TECHNICAL FIELD

The present disclosure relates to a field of display technology, and in particular to a light-emitting substrate, a method of manufacturing a light-emitting substrate, and a display device.

BACKGROUND

Light-emitting Diode (LED) technology has been developed for nearly 30 years, and its application range has been continuously expanded. For example, the LED technology may be applied in a display field and serve as a backlight source of a display device or as an LED display screen. With the development of technology, Mini Light-emitting Diode (Mini LED) display technology and Micro Light-emitting Diode (Micro LED) display technology have gradually become a hot spot in display device. LEDs have advantages of self-luminescence, wide viewing angle, fast response, simple structure, and long life. Moreover, Mini LED/Micro LED display screens may realize large-size display by splicing, and therefore have a good market prospect. At present, structures and manufacturing processes of Mini LED/Micro LED display devices are one of the important topics concerned by R&D personnel.

The above-mentioned information disclosed in this section is only for the understanding of the background of the inventive concept of the present disclosure. Therefore, the above-mentioned information may include information that does not constitute the related art.

SUMMARY

In order to solve at least one aspect of the problems described above, the embodiments of the present disclosure provide a light-emitting substrate, a method of manufacturing a light-emitting substrate, and a display device.

In an aspect, a light-emitting substrate is provided, and the light-emitting substrate includes:
a first substrate, including:
a first base substrate;
a light-emitting diode arranged on the first base substrate; and
a first conductive pad arranged on the first base substrate;
a second substrate arranged opposite to the first substrate, wherein the second substrate includes:
a second base substrate; and
a second conductive pad arranged on the second base substrate; and
a bonding wire structure including a bonding wire, wherein the first conductive pad is located on a surface of the first substrate away from the second substrate, the second conductive pad is located on a surface of the second substrate away from the first substrate, and the bonding wire is configured to electrically connect the first conductive pad and the second conductive pad.

According to some exemplary embodiments, the bonding wire structure further includes a first solder joint and a second solder joint, an end of the bonding wire is soldered to the first conductive pad at the first solder joint, and another end of the bonding wire is soldered to the second conductive pad at the second solder joint.

According to some exemplary embodiments, the light-emitting substrate further includes a gum, wherein the gum is arranged between the first substrate and the second substrate so as to attach the first substrate and the second substrate together.

According to some exemplary embodiments, the light-emitting substrate further includes a first protective adhesive layer, wherein the first substrate includes a first sidewall adjacent to the first conductive pad, the second substrate includes a second sidewall adjacent to the second conductive pad, and the first protective adhesive layer is in contact with at least the first sidewall and the second sidewall.

According to some exemplary embodiments, the gum includes a third sidewall, and an orthographic projection of the first sidewall on the first base substrate, an orthographic projection of the second sidewall on the first base substrate and an orthographic projection of the third sidewall on the first base substrate coincide with each other.

According to some exemplary embodiments, the first protective adhesive layer is further in contact with the third sidewall.

According to some exemplary embodiments, the light-emitting substrate further includes a second protective adhesive layer, wherein the bonding wire is sandwiched between the first protective adhesive layer and the second protective adhesive layer.

According to some exemplary embodiments, a projection of the second protective adhesive layer in a direction perpendicular to the first sidewall covers a projection of the bonding wire in the direction perpendicular to the first sidewall.

According to some exemplary embodiments, an orthographic projection of the second protective adhesive layer on the first base substrate covers each of an orthographic projection of the first conductive pad on the first base substrate, an orthographic projection of the first solder joint on the first base substrate, an orthographic projection of the second conductive pad on the first base substrate and an orthographic projection of the second solder joint on the first base substrate.

According to some exemplary embodiments, a surface of the first protective adhesive layer away from the first sidewall is in contact with the bonding wire, and a surface of the second protective adhesive layer close to the first sidewall is in contact with the bonding wire.

According to some exemplary embodiments, the bonding wire includes, at each of the first solder joint and the second solder joint, a portion that has an angle with a plane in which the first base substrate is located and/or that has a curved arc.

According to some exemplary embodiments, a projection of the first protective adhesive layer in a direction perpendicular to the first sidewall does not overlap with a projection of the third sidewall in the direction perpendicular to the first sidewall.

According to some exemplary embodiments, the light-emitting substrate further includes a first solder joint protective adhesive provided at the first solder joint and a second solder joint protective adhesive provided at the second solder joint, wherein an orthographic projection of the first solder joint protective adhesive on the first base substrate covers at least an orthographic projection of the first solder joint on the first base substrate, and an orthographic projection of the second solder joint protective adhesive on the first base substrate covers at least an orthographic projection of the second solder joint on the first base substrate.

According to some exemplary embodiments, the orthographic projection of the first solder joint protective adhesive on the first base substrate covers an orthographic projection of the first conductive pad on the first base substrate, and the orthographic projection of the second solder joint protective adhesive on the first base substrate covers an orthographic projection of the second conductive pad on the first base substrate.

According to some exemplary embodiments, the bonding wire is located on a side of the first protective adhesive layer away from the first sidewall, and a gap is formed between the first protective adhesive layer and the bonding wire in the direction perpendicular to the first sidewall.

According to some exemplary embodiments, the light-emitting substrate further includes a second protective adhesive layer, wherein the second protective adhesive layer covers the bonding wire and fills the gap between the first protective adhesive layer and the bonding wire.

According to some exemplary embodiments, an orthographic projection of the second protective adhesive layer on the first base substrate covers an orthographic projection of the bonding wire on the first base substrate, and a projection of the second protective adhesive layer in the direction perpendicular to the first sidewall covers a projection of the bonding wire in the direction perpendicular to the first sidewall.

According to some exemplary embodiments, the orthographic projection of the second protective adhesive layer on the first base substrate covers each of an orthographic projection of the first solder joint protective adhesive on the first base substrate and an orthographic projection of the second solder joint protective adhesive on the first base substrate.

According to some exemplary embodiments, a dimension of the second protective adhesive layer in the direction perpendicular to the first sidewall is equal to a dimension of the first protective adhesive layer in the direction perpendicular to the first sidewall.

According to some exemplary embodiments, the dimension of the first protective adhesive layer in the direction perpendicular to the first sidewall is within a range of 5 microns to 500 microns, and/or, a material of each of the first protective adhesive layer and the second protective adhesive layer has a Young's modulus within a range of 0.1 Mpa to 80 Gpa.

According to some exemplary embodiments, the light-emitting diode is a mini light-emitting diode or a micro light-emitting diode.

According to some exemplary embodiments, each of the first protective adhesive layer and the second protective adhesive layer includes an insulating adhesive material.

According to some exemplary embodiments, the second protective adhesive layer includes a black adhesive material.

According to some exemplary embodiments, the bonding wire has a diameter within a range of 10 microns to 500 microns.

According to some exemplary embodiments, the light-emitting substrate includes a plurality of light-emitting diodes, a plurality of first conductive pads, a plurality of second conductive pads and a plurality of bonding wires, and the plurality of bonding wires are configured to electrically connect the plurality of first conductive pads and the plurality of second conductive pads, respectively.

In another aspect, a display device including the light-emitting substrate described above is provided.

In another aspect, a method of manufacturing a light-emitting substrate is provided, and the method includes:

providing a first substrate, wherein the first substrate includes a first base substrate and a first conductive pad provided on the first base substrate;

bonding a light-emitting diode to the first substrate;

providing a second substrate, wherein the second substrate includes a second base substrate and a second conductive pad provided on the second based substrate;

placing the first substrate and the second substrate on a carrier so as to maintain a relative position of the first substrate and the second substrate;

forming a bonding wire structure to electrically connect the first conductive pad and the second conductive pad; and turning the second substrate toward the first substrate, so that a surface of the second base substrate away from the second conductive pad faces the first substrate, that the first conductive pad is located on a surface of the first substrate away from the second substrate, and that the second conductive pad is located on a surface of the second substrate away from the first substrate, wherein the bonding wire structure includes a bonding wire configured to electrically connect the first conductive pad and the second conductive pad.

According to some exemplary embodiments, the placing the first substrate and the second substrate on a carrier so as to maintain a relative position of the first substrate and the second substrate includes:

separating the first substrate and the second substrate by a predetermined distance, so that the first conductive pad and the second conductive pad are separated by a predetermined distance, and that a first surface of the first conductive pad away from the first base substrate and a second surface of the second conductive pad away from the second base substrate are located in a same horizontal plane.

According to some exemplary embodiments, after placing the first substrate and the second substrate on the carrier and before forming the bonding wire structure, the method further includes:

forming a first protective adhesive layer in a gap formed between the first conductive pad and the second conductive pad, so that an orthographic projection of the first protective adhesive layer on the carrier covers an orthographic projection of the gap on the carrier, and that a third surface of the first protective adhesive layer away from the carrier is located in the same horizontal plane as the first surface.

According to some exemplary embodiments, the forming a bonding wire structure includes:

forming the bonding wire in a plane in which the first conductive pad and the second conductive pad are located.

According to some exemplary embodiments, after forming the bonding wire structure and before turning the second substrate toward the first substrate, the method further includes:

forming a second protective adhesive layer on each of a surface of the first conductive pad away from the first base substrate or the second base substrate, a surface of the second conductive pad away from the first base substrate or the second base substrate and a surface of the bonding wire away from the first base substrate or the second base substrate, so that a projection of the second protective adhesive layer in a direction perpendicular to the first surface covers each of a projection of the first conductive pad in the direction perpendicular to the first surface, a projection of the second conductive pad in the direction perpendicular to the first surface and a projection of the bonding wire in the direction perpendicular to the first surface.

According to some exemplary embodiments, the placing the first substrate and the second substrate on a carrier so as to maintain a relative position of the first substrate and the second substrate includes:

separating the first substrate and the second substrate by a predetermined distance so that the first conductive pad and the second conductive pad are separated by a predetermined distance, and that a first surface of the first conductive pad away from the first base substrate and a second surface of the second conductive pad away from the second base substrate are located in different horizontal planes.

According to some exemplary embodiments, after placing the first substrate and the second substrate on the carrier and before forming the bonding wire structure, the method further includes:

forming a first protective adhesive layer so that the first protective adhesive layer covers at least a first sidewall of the first substrate adjacent to the first conductive pad and a second sidewall of the second substrate adjacent to the second conductive pad.

According to some exemplary embodiments, the forming a bonding wire structure includes:

soldering an end of the bonding wire to the first conductive pad so as to form a first solder joint at the first conductive pad, and soldering another end of the bonding wire to the second conductive pad so as to form a second solder joint at the second conductive pad, wherein the bonding wire includes, at each of the first solder joint and the second solder joint, a portion that has an angle with a plane in which the first base substrate is located and/or that has a curved arc.

According to some exemplary embodiments, after forming the bonding wire structure and before turning the second substrate toward the first substrate, the method further includes:

performing an adhesive dispensing in an area where the first solder joint is located and an area where the second solder joint is located, so as to form a first solder joint protective adhesive in the area where the first solder joint is located and form a second solder joint protective adhesive in the area where the second solder joint is located.

According to some exemplary embodiments, after turning the second substrate toward the first substrate, the method further includes:

forming a second protective adhesive layer, so that the second protective adhesive layer covers the first conductive pad, the bonding wire and the second conductive pad.

According to some exemplary embodiments, before turning the second substrate toward the first substrate, the method further includes:

attaching a gum to one of a surface of the first base substrate away from the first conductive pad and a surface of the second base substrate away from the second conductive pad, wherein the turning the second substrate toward the first substrate includes: attaching another of the surface of the first base substrate away from the first conductive pad and the surface of the second base substrate away from the second conductive pad to the adhesive.

According to some exemplary embodiments, the first substrate includes a first sidewall adjacent to the at least one first conductive pad, the second substrate includes a second sidewall adjacent to the at least one second conductive pad, and the second substrate is turned toward the first substrate so that the first protective adhesive layer is in contact with at least the first sidewall and the second sidewall.

According to some exemplary embodiments, a separation distance between the first substrate and the second substrate is greater than a sum of a thickness of the first substrate and a thickness of the second substrate.

According to some exemplary embodiments, the forming a first protective adhesive layer includes:

forming a protective film on the first substrate, wherein the protective film covers the light-emitting diode and the first conductive pad;

forming a first protective adhesive layer on the first substrate, wherein the first protective adhesive layer covers at least the first sidewall of the first substrate adjacent to the first conductive pad, and the orthographic projection of the first protective adhesive layer on the first base substrate at least partially overlaps each of the orthographic projection of the first conductive pad on the first base substrate and the orthographic projection of the protective film on the first base substrate; and removing at least a part of the protective film and an overlapping portion of the first protective adhesive layer and the protective film, so as to expose the first conductive pad.

BRIEF DESCRIPTION OF THE DRAWINGS

With following description of the present disclosure with reference to the accompanying drawings, other objectives and advantages of the present disclosure may be obvious and the present disclosure may be understood comprehensively, and in the accompanying drawings:

FIG. 1 shows a state of a first substrate and a second substrate included in the light-emitting substrate before being folded or turned over;

Figure 1:
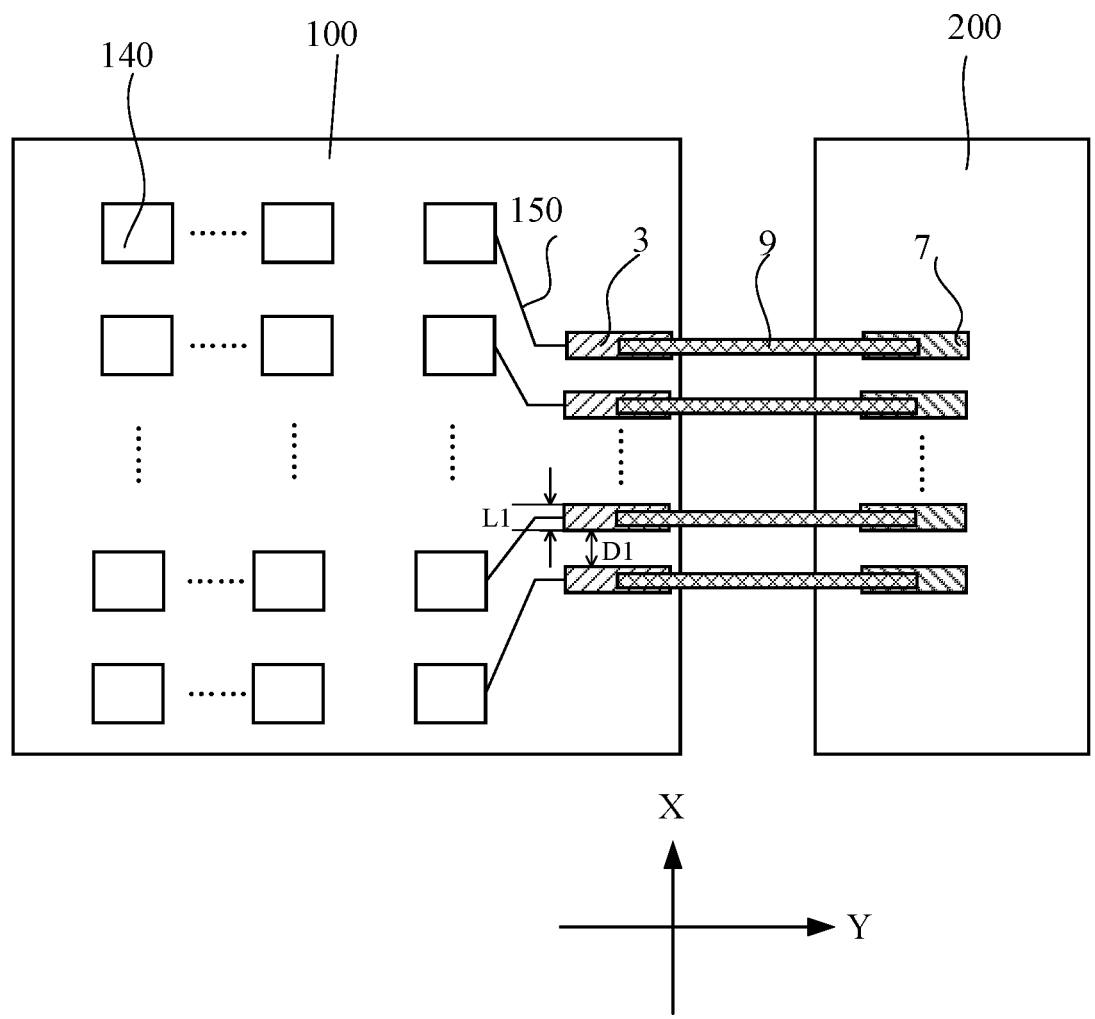
FIG. 1 shows a schematic plan view of a light-emitting substrate according to some exemplary embodiments of the present disclosure.

It should be noted that for the sake of clarity, in the accompanying drawings used to describe the embodiments of the present disclosure, dimensions of layers, structures or areas may be enlarged or reduced, that is, these accompanying drawings are not drawn according to actual scale.

DETAILED DESCRIPTION OF EMBODIMENTS

In the following description, for the purpose of explanation, many specific details are set forth to provide a comprehensive understanding of various exemplary embodiments. However, it is obvious that the various exemplary embodiments may be implemented without these specific details or with one or more equivalent arrangements. In other cases, well-known structures and devices are shown in block diagrams in order to avoid unnecessarily obscuring the various exemplary embodiments. In addition, the various exemplary embodiments may be different, but need not be exclusive. For example, without departing from the inventive concept, specific shape, configuration and characteristics of an exemplary embodiment may be used or implemented in another exemplary embodiment.

In the accompanying drawings, for clarity and/or description purposes, dimension and relative dimension of elements may be enlarged. Accordingly, the dimension and relative dimension of each element need not to be limited to those shown in the drawings. When the exemplary embodiments may be implemented differently, the specific process sequence may be different from the sequence described. For example, two consecutively described processes may be performed substantially simultaneously or in a reverse order. In addition, same reference numerals represent same elements.

When an element is described as being "on", "connected to" or "coupled to" another element, the element may be directly on the another element, directly connected to the another element, or directly coupled to the another element, or an intermediate element may be present. However, when an element is described as being "directly on", "directly connected to" or "directly coupled to" another element, no intermediate element is provided. Other terms and/or expressions used to describe the relationship between elements, for example, "between" and "directly between", "adjacent" and "directly adjacent", "on" and "directly on", and so on, should be interpreted in a similar manner. In addition, the term "connected" may refer to a physical connection, an electrical connection, a communication connection, and/or a fluid connection. In addition, X-axis, Y-axis and Z-axis are not limited to three axes of a rectangular coordinate system, and may be interpreted in a broader meaning. For example, the X-axis, the Y-axis and the Z-axis may be perpendicular to each other, or may represent different directions that are not perpendicular to each other. For the objective of the present disclosure, "at least one of X, Y and Z" and "at least one selected from a group consisting of X, Y and Z" may be interpreted as only X, only Y, only Z, or any combination of two or more of X, Y and Z, such as XYZ, XYY, YZ and ZZ. As used herein, the term "and/or" includes any and all combinations of one or more of the listed related items.

It should be understood that, although terms "first," "second" and so on may be used herein to describe different elements, these elements should not be limited by these terms. These terms are only used to distinguish one element from another element. For example, without departing from the scope of the exemplary embodiments, a first element may be named as a second element, and similarly, the second element may be named as the first element.

In the present disclosure, an inorganic light-emitting diode refers to a light-emitting element made of an inorganic material, and LED refers to an inorganic light-emitting element that is different from the OLED. Specifically, the inorganic light-emitting element may include a Mini Light-emitting Diode (Mini LED) and a Micro Light-emitting Diode (Micro LED). The micro light-emitting diode (that is, the Micro LED) refers to an ultra-small light-emitting diode with a grain size of less than 100 microns, and the mini light-emitting diode (that is, the Mini LED) refers to a small-sized light-emitting diode with a grain size between that of the Micro LED and that of a conventional LED. For example, the grain size of the Mini LED may range from 100 microns to 300 microns, and the grain size of the Micro LED may range from 10 microns to 100 microns.

Some exemplary embodiments of the present disclosure provide a light-emitting substrate, a method of manufacturing the light-emitting substrate, and a display device including the light-emitting substrate. For example, some embodiments of the present disclosure provide a light-emitting substrate, and the light-emitting substrate includes: a first substrate, in which the first substrate includes a first base substrate, a light-emitting diode arranged on the first base substrate, and a first conductive pad arranged on the first base substrate; a second substrate arranged opposite to the first substrate, in which the second substrate includes a second base substrate, and a second conductive pad arranged on the second base substrate; and a bonding wire structure including a bonding wire, in which the first conductive pad is located on a surface of the first substrate away from the second substrate, the second conductive pad is located on a surface of the second substrate away from the first substrate, and the bonding wire electrically connects the first conductive pad and the second conductive pad. In this way, a structure of the light-emitting substrate may be simplified, and a process complexity may be reduced, so that a product yield may be improved, and manufacturing costs may be saved.

Wire Bonding is a process for tightly soldering a metal bonding wire and a substrate pad by using heat, pressure or ultrasonic energy. For example, in IC encapsulation, the wire bonding may be performed to connect a semiconductor chip soldering area with an I/O bonding wire of a microelectronic encapsulation or a metal wiring soldering area on a substrate by using a metal filament. A principle of the wire bonding is to destroy an oxide layer and pollution on a soldered surface by heating, pressurizing or ultrasonic, and produce a plastic deformation, so that the metal bonding wire is in close contact with the soldered surface so as to reach a range of gravitational force between atoms and cause a diffusion of atoms between interfaces to form a solder joint.

Figure 2:
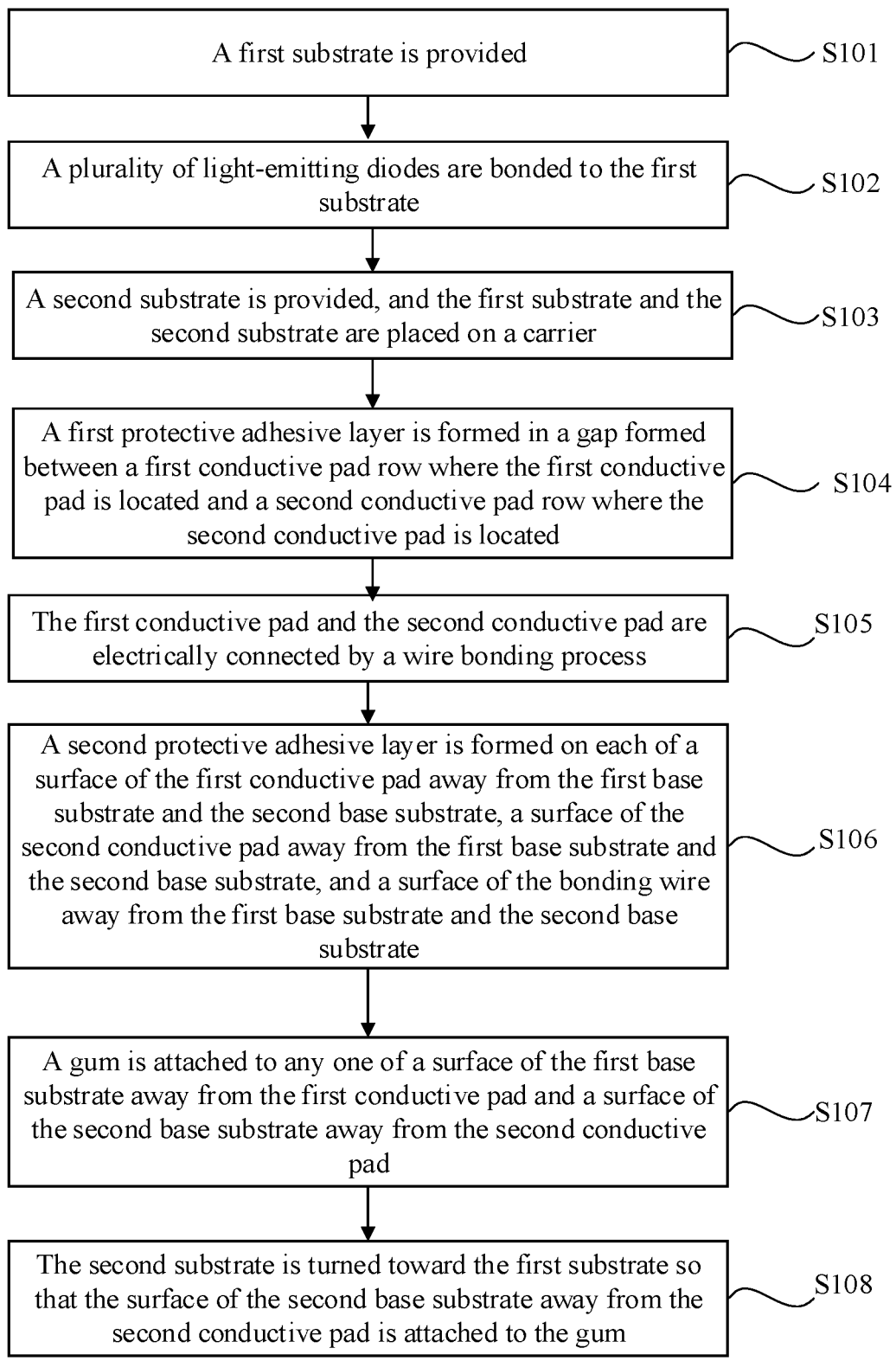
FIG. 2 shows a flowchart of a method of manufacturing a light-emitting substrate according to some exemplary embodiments of the present disclosure.

FIG. 1 shows a schematic plan view of a light-emitting substrate according to some exemplary embodiments of the present disclosure. It should be noted that, for illustration, FIG. 1 shows a state of the first substrate and the second substrate included in the light-emitting substrate before being folded or turned over. FIG. 2 shows a flowchart of a method of manufacturing a light-emitting substrate according to some exemplary embodiments of the present disclosure. FIG. 3A to FIG. 3H schematically show cross-sectional views of structures formed after some steps of the method of manufacturing the light-emitting substrate are performed. Referring to FIG. 1 to FIG. 3H in combination, the method of manufacturing the light-emitting substrate may be performed according to following steps.

In step S101, a first substrate 100 is provided.

Figure 3A:
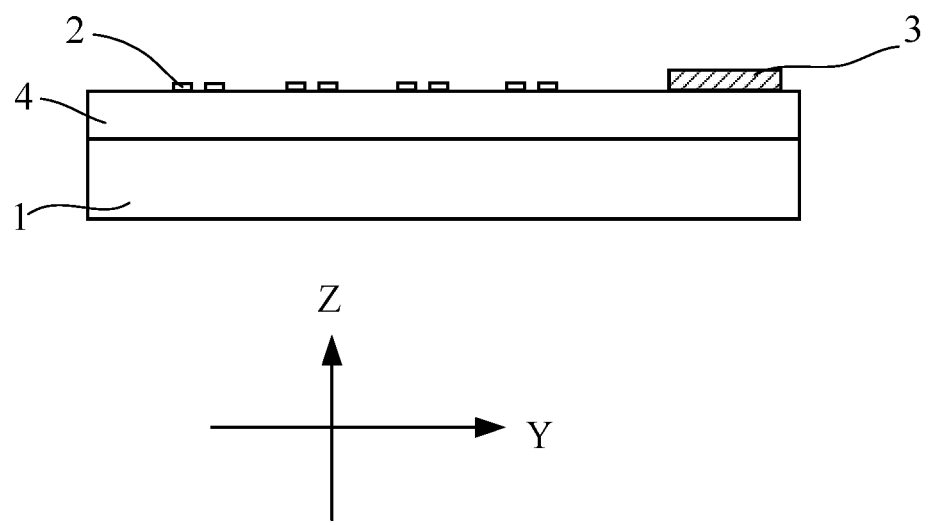
FIG. 3A to FIG. 3H schematically show cross-sectional views of structures formed after some steps in a method of manufacturing a light-emitting substrate are performed.

Referring to FIG. 1 and FIG. 3A, the first substrate 100 may include a first base substrate 1, and a plurality of first electrodes 2 and a plurality of first conductive pads 3 arranged on the first base substrate 1. The plurality of first conductive pads 3 are located at an edge of the first substrate 100. For example, the plurality of first conductive pads 3 are located in a fan-out area of the first substrate 100, and may be used to electrically connect signal lines (for example, part of signal lines 150 schematically shown in FIG. 1) located on the first substrate 100 to an external driving circuit.

For example, a material of the first base substrate 1 may include, but not be limited to, glass, quartz, plastic, silicon, polyimide, and the like. The first electrode 2 and the first conductive pad 3 may have a columnar structure. A material of the first electrode 2 and the first conductive pad 3 may include a conductive material, such as a metal material, etc., which may be specifically at least one or a combination of at least two selected from gold, silver, copper, aluminum, molybdenum, gold alloy, silver alloy, copper alloy, aluminum alloy, molybdenum alloy and the like, and which are not limited in the embodiments of the present disclosure.

For example, the first substrate 100 may further include a driving circuit 4 electrically connected to the plurality of first electrodes 2, and the driving circuit 4 is arranged on the first base substrate 1. The driving circuit 4 may be used to provide electrical signals to light-emitting diode chips subsequently formed on the plurality of first electrodes 2 so as to control brightness of the light-emitting diode chips. For example, in some examples, the driving circuit 4 may include a plurality of pixel driving circuits connected in a one-to-one correspondence with the light-emitting diode chips, or a plurality of micro integrated circuit chips connected in a one-to-one correspondence with the light-emitting diode chips, or other structures that may control the light-emitting diode chips to emit light of different brightness gray scales. It should be noted that the specific circuit structure of the driving circuit 4 on the first substrate 100 may be set according to actual needs, which is not limited in the embodiments of the present disclosure. Hereinafter, the driving circuit 4 will be exemplarily described in conjunction with the drawings.

In step S102, a plurality of light-emitting diodes 5 are transferred and bonded to the first substrate 100.

Figure 3B:
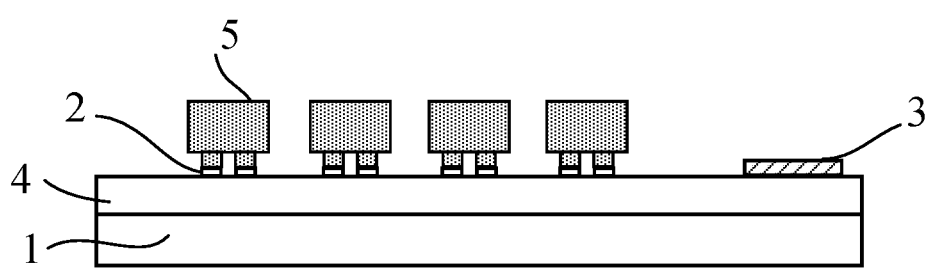

Referring to FIG. 1 and FIG. 3B, each of the plurality of light-emitting diodes 5 may include an N electrode and a P electrode that are respectively connected to the corresponding first electrodes 2, and surfaces of the plurality of first conductive pads 3 are exposed.

Referring to FIG. 1, the plurality of light-emitting diodes may be arranged in an array in a first direction X and a second direction Y. For example, the first direction X is a row direction and the second direction Y is a column direction. The embodiments of the present disclosure are not limited to this. The first direction and the second direction may be any directions, as long as the first direction and the second direction intersect each other. Moreover, the plurality of light-emitting diodes are not limited to being arranged along a straight line, and may also be arranged along a curve, along a ring, or in any manner, which may be determined according to actual needs, and which is not limited by the embodiments of the present disclosure.

The plurality of first conductive pads 3 are arranged at an edge of the first substrate 100 in the first direction X, that is, the plurality of first conductive pads 3 form a first conductive pad row. For example, the plurality of first conductive pads 3 are arranged at equal intervals in the first direction X. Each first conductive pad 3 has a dimension L1 in the first direction X, and a distance between two adjacent first conductive pads 3 in the first direction X is D1. A sum of the dimension L1 of any first conductive pad 3 in the first direction X and the distance D1 between two adjacent first conductive pads 3 in the first direction X may be referred to as an arrangement period of the first conductive pads 3. In some examples, the arrangement period is greater than 40 microns.

For example, the light-emitting diode may include a micro light-emitting diode (Micro-LED) or a mini light-emitting diode (Mini-LED).

In step S103, a second substrate 200 is provided, and the first substrate 100 and the second substrate 200 are placed on a carrier 300.

For example, the second substrate 200 may be a circuit board, such as PCB (Printed Circuit Board), FPC (Flexible Printed Circuit), COF (Chip on Film), or the like.

Figure 3C:
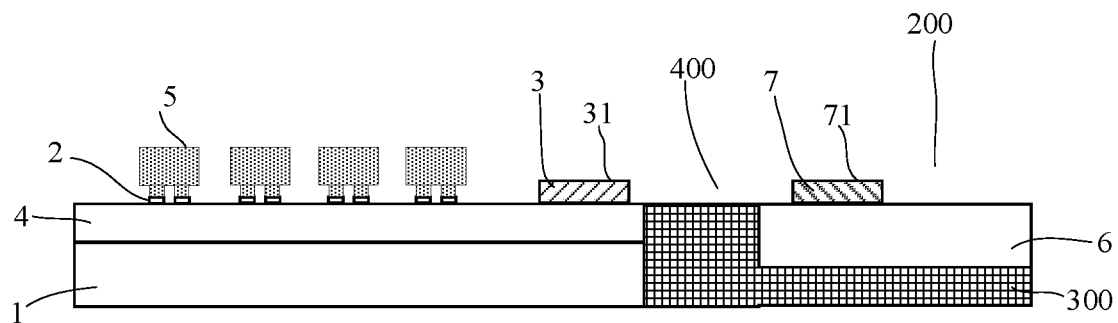

Referring to FIG. 3C, the second substrate 200 may include a second base substrate 6 and a plurality of second conductive pads 7 provided on the second base substrate 6. For example, the plurality of second conductive pads 7 may be arranged in the first direction X (a direction perpendicular to a paper surface in FIG. 3C), that is, the plurality of second conductive pads 7 form a second conductive pad row. For example, the plurality of second conductive pads 7 may correspond to the plurality of first conductive pads 3 one-to-one. That is, an arrangement period of the second conductive pads 7 is the same as the arrangement period of the first conductive pads 3.

The second substrate 200 may further include an external driving circuit, such as an integrated circuit chip, provided on the second base substrate 6, and the embodiments of the present disclosure are not limited thereto.

The carrier 300 is used to separate and fix the first substrate 100 and the second substrate 200 so as to maintain a relative positional relationship between the first substrate 100 and the second substrate 200. Referring to FIG. 3C, the first conductive pad 3 provided on the first substrate 100 has a first surface 31 (an upper surface shown) away from the first base substrate 1, and the second conductive pad 7 provided on the second substrate 200 has a second surface 71 (an upper surface shown) away from the second base substrate 6. Under the fixing action of the carrier 300, the first substrate 100 and the second substrate 200 are separated by a predetermined distance. Accordingly, the first conductive pad row where the first conductive pad 3 is located and the second conductive pad row where the second conductive pad 7 is located are also separated by a predetermined distance, and the first surface 31 of the first conductive pad 3 and the second surface 71 of the second conductive pad 7 are located in a same horizontal plane so as to ensure that subsequent bonding wires are led out in a same plane. For example, in some exemplary embodiments, the predetermined distance may be greater than or equal to a sum of a thickness of the first substrate 100 and a thickness of the second substrate 200, and less than 1.5 times the sum of the thickness of the first substrate 100 and the thickness of the second substrate 200. For another example, the predetermined distance may be substantially equal to the sum of the thicknesses of the first substrate 100 and the thickness of the second substrate 200.

Figure 3D:
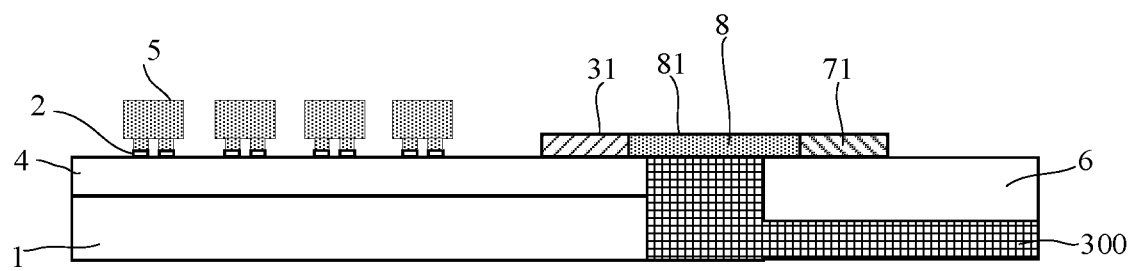

In step S104, with reference to FIG. 3C and FIG. 3D, a first protective adhesive layer 8 is formed in a gap 400 formed between the first conductive pad row where the first conductive pad 3 is located and the second conductive pad row where the second conductive pad 7 is located.

For example, a certain thickness of protective adhesive may be applied in the gap 400, and the protective adhesive fills at least the gap 400. Furthermore, due to a limitation of application precision, the protective adhesive may further cover at least a part of a surface of the first conductive pad 3 and a surface of the second conductive pad 7 on both sides of the gap 400. A part of the protective adhesive covering the first conductive pad 3 and the second conductive pad 7 may be removed later by laser ablation or film removal, so as not to affect the subsequent process, thereby obtaining the first protective adhesive layer 8 only filled in the gap 400. It may be understood that an orthographic projection of the first protective adhesive layer 8 on the carrier 300 covers an orthographic projection of the gap 400 on the carrier 300.

Referring to FIG. 3D, a sidewall of the first protective adhesive layer 8 close to the first substrate 100 is in contact with the first conductive pad 3, and a sidewall of the first protective adhesive layer 8 close to the second substrate 200 is in contact with the second conductive pad 7.

For example, the first protective adhesive layer 8 includes a third surface 81 away from the carrier 300. The third surface 81, the first surface 31 and the second surface 71 are substantially located in the same horizontal plane so as to ensure that subsequent bonding wires are formed on a flat surface.

For example, a thickness of the first protective adhesive layer 8 may be in a range of 5 microns to 500 microns, and the specific value is the same as a thickness of the first conductive pad 3 and/or a thickness of the second conductive pad 7. A material of the first protective adhesive layer 8 may have a Young's modulus within a range of 0.1 Mpa to 80 Gpa. For example, the material of the first protective adhesive layer 8 may be silica gel or polydimethylsiloxane (PDMS).

In step S105, a bonding wire 9 is formed so that the bonding wire 9 electrically connects the first conductive pad 3 and the second conductive pad 7.

Figure 3E:
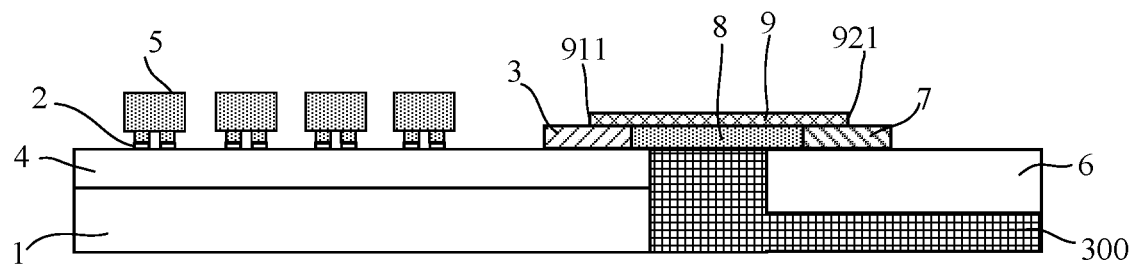

Referring to FIG. 3E, the bonding wire 9 is formed so that an end 91 of the bonding wire 9 is connected to the first conductive pad 3 and another end 92 is connected to the second conductive pad 7. That is, the end 91 of the bonding wire 9 is soldered to the first conductive pad 3, and the another end 92 of the bonding wire 9 is soldered to the second conductive pad 7. A solder joint where the end 91 is soldered to the first conductive pad 3 is referred to as a first solder joint 911, and a solder joint where the end 92 is soldered to the second conductive pad 7 is referred to as a second solder joint 921, which are shown in FIG. 3H.

In the embodiments shown in FIG. 3E, the bonding wire 9 substantially extends in a plane where the first conductive pad 3 and the second conductive pad 7 are located, so as to facilitate the subsequent bending process.

For example, the first solder joint 911 may be a wedge-shaped solder joint, that is, an orthographic projection of the first solder joint 911 on the first base substrate 1 is a wedge. In this case, a height of the first solder joint 911 on the first conductive pad 3 may be controlled within a range of 1 micron to 10 microns. A diameter of the bonding wire 9 may be within a range of 10 microns to 500 microns. The height of the first solder joint 911 on the first conductive pad 3 is less than the diameter of the bonding wire 9. In this way, the bonding wire 9 may extend substantially in the plane where the first conductive pad 3 and the second conductive pad 7 are located.

For example, the bonding wire 9 may be made of a metal such as Cu, Al, Au, Ag, or alloys thereof.

Referring to FIG. 1 and FIG. 3E in combination, each bonding wire 9 is electrically connected to a first conductive pad 3 and a second conductive pad 7 corresponding to the first conductive pad 3. Since the plurality of first conductive pads 3 are arranged at equal intervals in the first direction X, the plurality of bonding wires 9 are also arranged at equal intervals in the first direction X.

For example, the diameter of the bonding wire 9 may be within a range of 10 microns to 500 microns. When the first solder joint 911 is a wedge-shaped solder joint, the dimension L1 described above is about 1.2 to 3 times the diameter of the bonding wire.

It should be understood that the arrangement period of the plurality of first conductive pads 3 is related to the diameter of the bonding wire 9 and is further related to a wiring design on the first substrate 100.

In step S106, a second protective adhesive layer 11 is formed on each of a surface of the first conductive pad 3 away from the first base substrate 1 and the second base substrate 6, a surface of the second conductive pad 7 away from the first base substrate 1 and the second base substrate 6, and a surface of the bonding wire 9 away from the first base substrate 1 and the second base substrate 6.

Figure 3F:
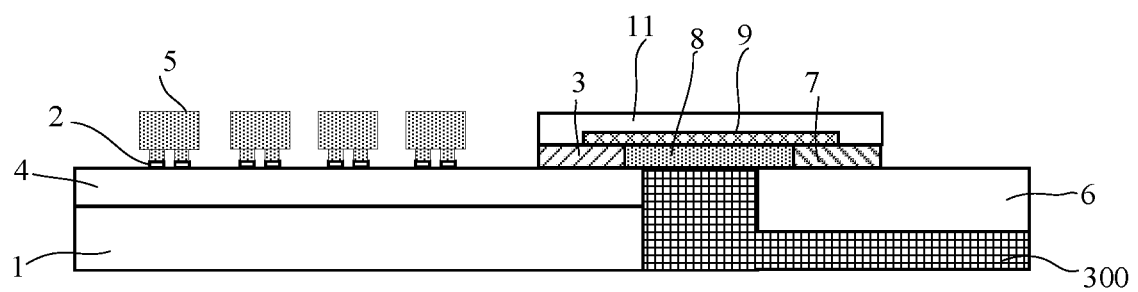

Referring to FIG. 3F, an orthographic projection of the second protective adhesive layer 11 in a direction perpendicular to the first surface 31 covers each of an orthographic projection of the first conductive pad 3 in the direction perpendicular to the first surface 31, an orthographic projection of the second conductive pad 7 in the direction perpendicular to the first surface 31, and an orthographic projection of the bonding wire 9 in the direction perpendicular to the first surface 31. In this way, the bonding wire 9, the solder joint between the first conductive pad 3 and the bonding wire 9, and the solder joint between the second conductive pad 7 and the bonding wire 9 may be protected.

For example, a thickness of the second protective adhesive layer 11 may be within a range of 5 microns to 500 microns, and a material of the second protective adhesive layer 11 may have a Young's modulus within a range of 0.1 Mpa to 80 Gpa. For example, the material of the second protective adhesive layer 11 may be silica gel or polydimethylsiloxane (PDMS).

In some examples, a thickness of the second protective adhesive layer 11 may be substantially equal to the thickness of the first protective adhesive layer 8. In this way, it may be ensured that the bonding wire 9 is located at a neutral layer of the upper and lower protective adhesive layers.

Figure 4A:
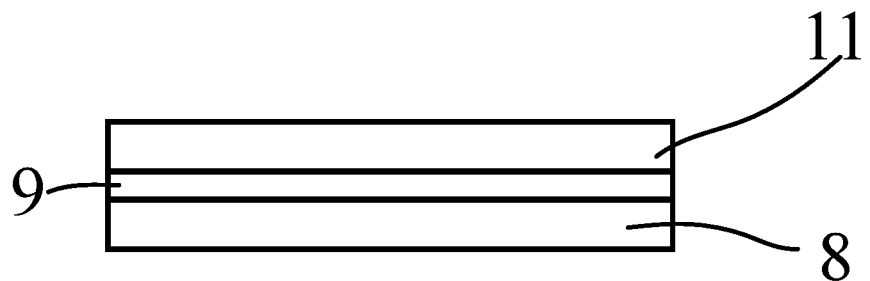
FIG. 4A and FIG. 4B schematically show a schematic diagram of a state of a three-layer stacked structure before being bent and a schematic diagram of a state of a three-layer stacked structure after being bent, respectively.
Figure 4B:
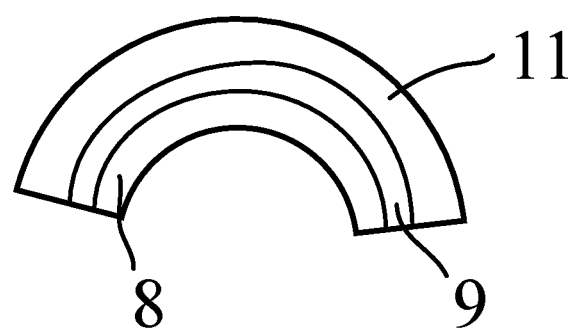

Specifically, referring to FIG. 4A and FIG. 4B, the bonding wire 9 is sandwiched between the first protective adhesive layer 8 and the second protective adhesive layer 11 so as to form a stacked structure. When the stacked structure is bent, the second protective adhesive layer 11 located above is subjected to tensile stress, and the first protective adhesive layer 8 located below is subjected to compressive stress. Since the thickness of the second protective adhesive layer 11 is substantially equal to the thickness of the first protective adhesive layer 8, the stress on the bonding wire 9 located in the middle is substantially zero. That is, the bonding wire 9 is located in a bending neutral layer. In this way, an amount of deformation of the bonding wire may be reduced, so that the reliability may be improved.

In step S107, a gum 12 is attached to any one of a surface of the first base substrate 1 away from the first conductive pad 3 and a surface of the second base substrate 6 away from the second conductive pad 7. For example, referring to FIG. 3G, the gum 12 is attached to the surface of the first base substrate 1 away from the first conductive pad 3.

Figure 3G:
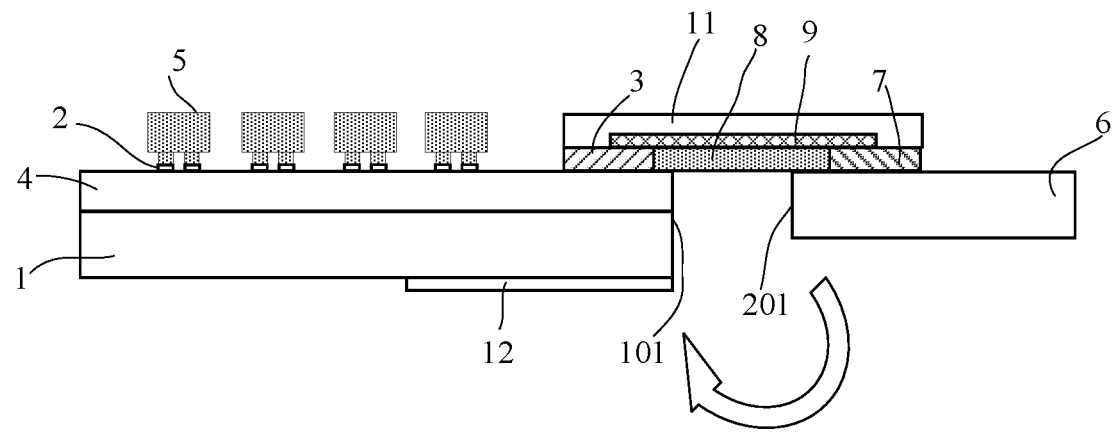
Figure 3H:
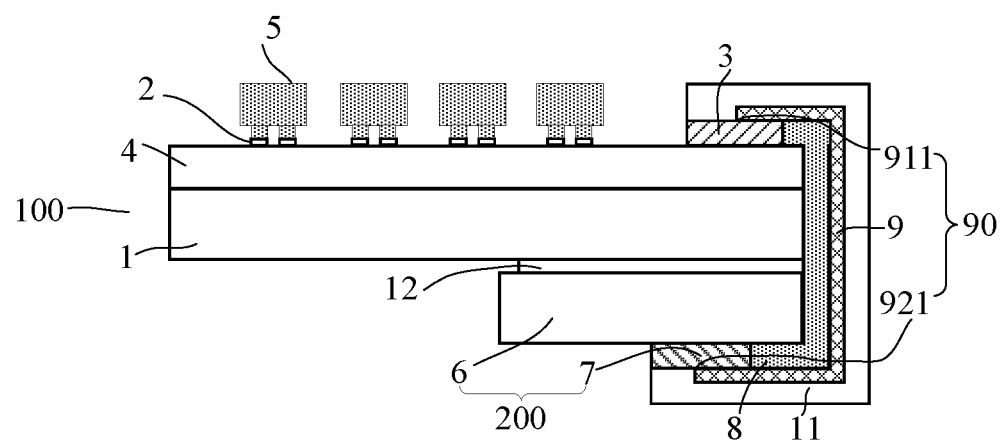

In step S108, referring to FIG. 3G and FIG. 3H in combination, the second substrate 200 is turned toward the first substrate 100 so that the surface of the second base substrate 6 away from the second conductive pad 7 is attached to the gum 12.

In this way, the second substrate 200 may be bent to a rear surface of the first substrate 100, and the two substrates 100 and 200 may be attached together by the gum 12.

For example, in a process of turning the second substrate 200, the second substrate 200 may be rotated to a lower surface of the first substrate 100 by the carrier 300 with a fixed rotation track, so as to ensure the stability of the turning process and reduce risk of breakage of the bonding wire 9.

Continuing to refer to FIG. 3H, in step S108, the second substrate 200 is turned over so that a surface of the first protective adhesive layer 8 away from the bonding wire 9 is in contact with the first substrate 100, the gum 12 and the second substrate 200. Specifically, the surface of the first protective adhesive layer 8 away from the bonding wire 9 is in contact with a sidewall of the first substrate 100, a sidewall of the gum 12 and a sidewall of the second substrate 200. In this way, the sidewall of the first substrate 100, the sidewall of the gum 12 and the sidewall of the second substrate 200 may completely support the first protective adhesive layer 8, so as to completely support the bonding wire 9 to improve reliability.

In the method of manufacturing the light-emitting substrate according to the embodiments of the present disclosure, the bonding wire is fabricated by using a wire bonding process, and the substrate is turned over to achieve a stacked structure of the upper and lower substrates, so that the process complexity may be reduced, and manufacturing costs may be reduced.

Figure 5:
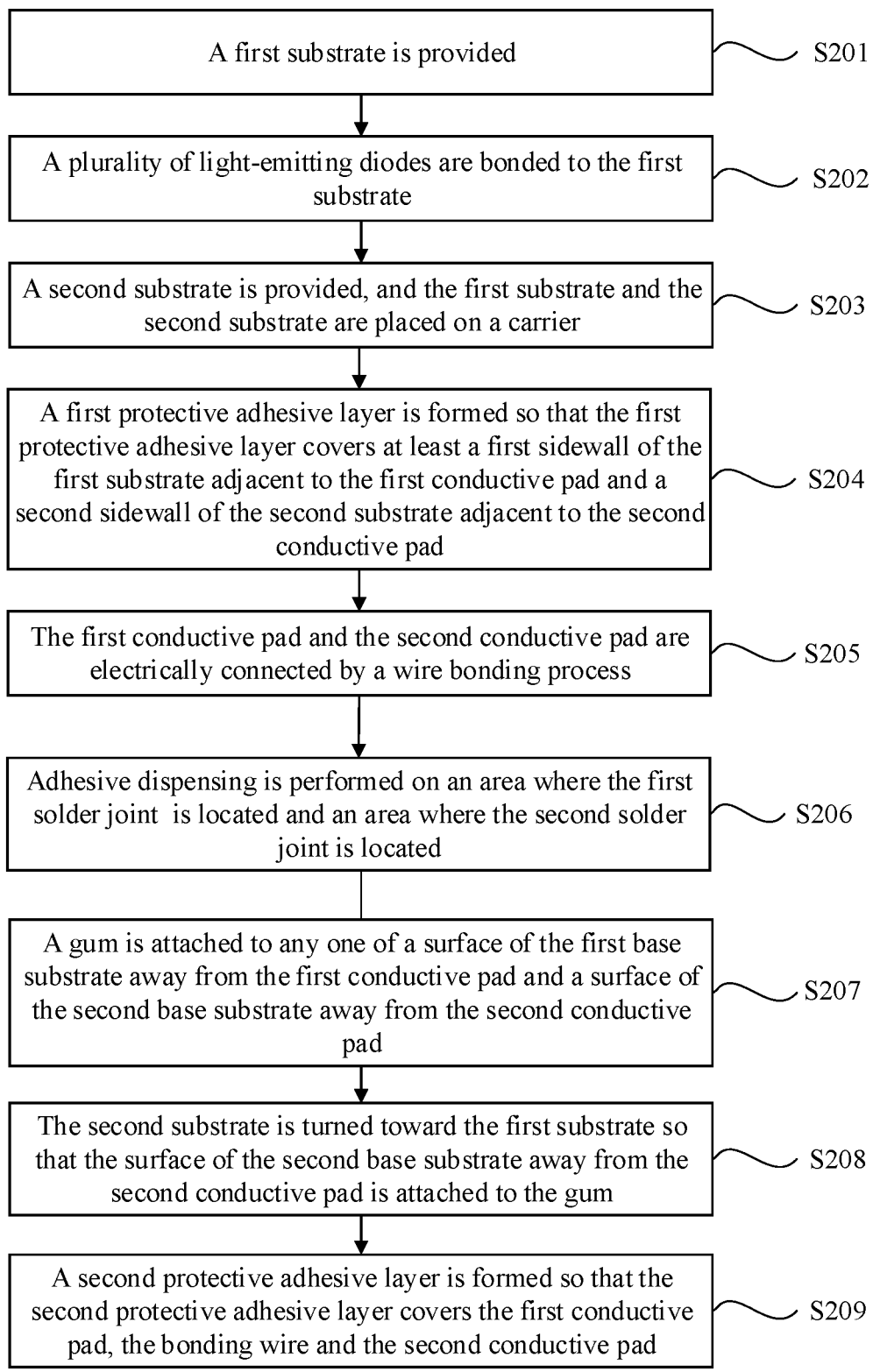
FIG. 5 shows a flowchart of a method of manufacturing a light-emitting substrate according to some exemplary embodiments of the present disclosure.

FIG. 5 shows a flowchart of a method of manufacturing a light-emitting substrate according to some exemplary embodiments of the present disclosure. FIG. 6A to FIG. 6H schematically show cross-sectional views of structures formed after some steps of the method of manufacturing the light-emitting substrate are performed. Referring to FIG. 1 and FIG. 5 to FIG. 6H in combination, the method of manufacturing the light-emitting substrate may be performed according to following steps.

It should be noted that the following will focus on the differences from the embodiments shown in FIG. 2 to FIG. 3H. For the same parts, reference may be made to the above description.

In step S201, the first substrate 100 is provided.

Figure 6A:
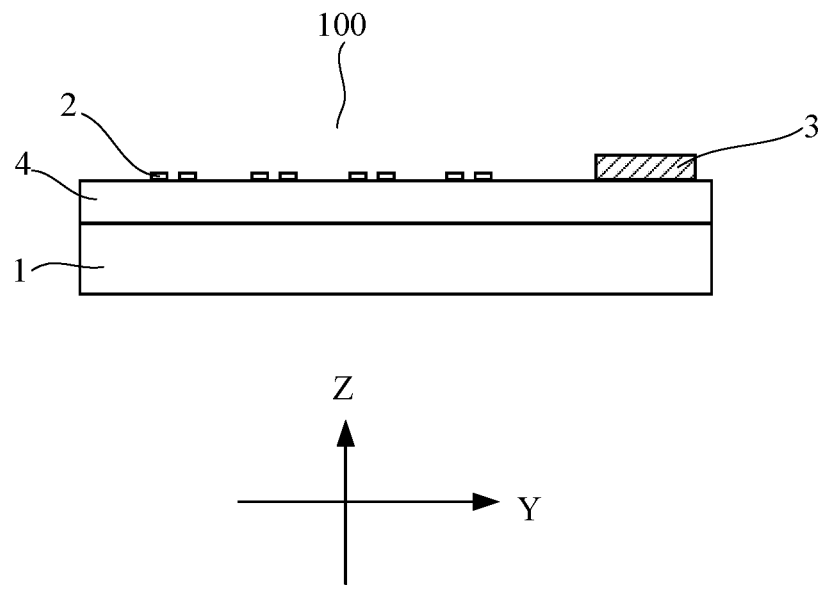
FIG. 6A to FIG. 6H schematically show cross-sectional views of structures formed after some steps in a method of manufacturing a light-emitting substrate are performed.

Referring to FIG. 1 and FIG. 6A, the first substrate 100 may include a first base substrate 1, and a plurality of first electrodes 2 and a plurality of first conductive pads 3 arranged on the first base substrate 1. The plurality of first conductive pads 3 are located at an edge of the first substrate 100.

In step S202, a plurality of light-emitting diodes 5 are transferred and bonded to the first substrate 100.

Figure 6B:
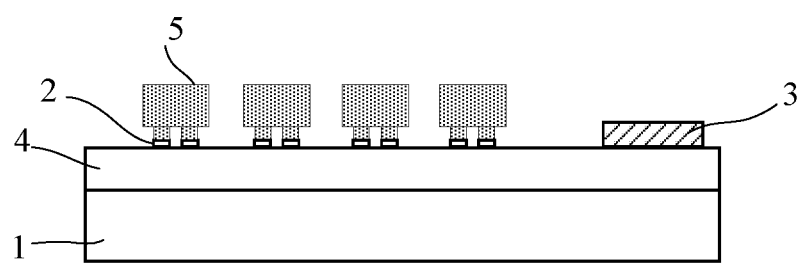

Referring to FIG. 1 and FIG. 6B, each of the plurality of light-emitting diodes 5 may include an N electrode and a P electrode that are respectively connected to the corresponding first electrodes 2, and surfaces of the plurality of first conductive pads 3 are exposed.

In step S203, the second substrate 200 is provided, and the first substrate 100 and the second substrate 200 are placed on a carrier 300'.

Figure 6C:
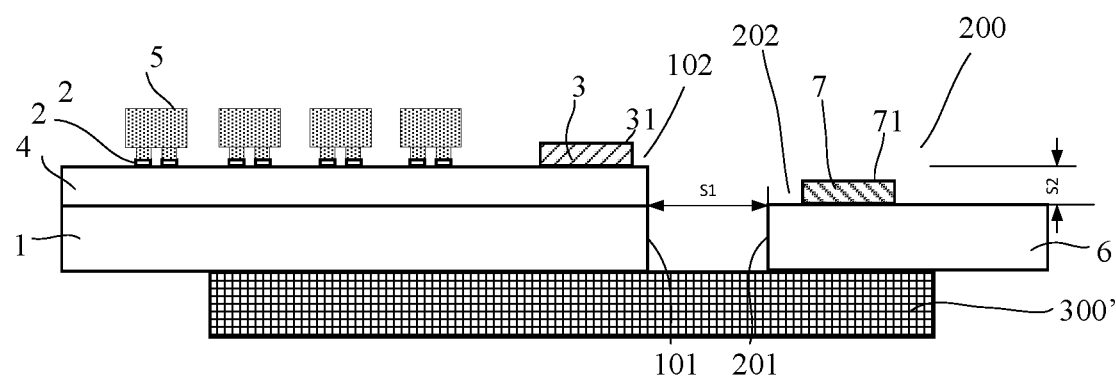

The carrier 300' is used to separate and fix the first substrate 100 and the second substrate 200 so as to maintain a relative positional relationship between the first substrate 100 and the second substrate 200. Referring to FIG. 6C, the first conductive pad 3 provided on the first substrate 100 has a first surface 31 (an upper surface shown) away from the first base substrate 1, and the second conductive pad 7 provided on the second substrate 200 has a second surface 71 (an upper surface shown) away from the second base substrate 6. Under the fixing action of the carrier 300', the first substrate 100 and the second substrate 200 are separated by a predetermined distance. Accordingly, the first conductive pad row where the first conductive pad 3 is located and the second conductive pad row where the second conductive pad 7 is located are also separated by a predetermined distance.

Specifically, the first substrate 100 and the second substrate 200 are separated by a certain distance in each of the second direction Y and a third direction Z. The third direction Z may be a direction perpendicular to the plane where the first direction X and the second direction Y are located, and is shown as a height direction in FIG. 6C. For example, a distance between the first substrate 100 and the second substrate 200 in the second direction Y is S1 (hereinafter referred to as a first separation distance), and a distance between the first substrate 100 and the second substrate 200 in the third direction Z is S2 (hereinafter referred to as a second separation distance).

For example, the first separation distance S1 may be greater than or equal to the sum of the thickness of the first substrate 100 and the thickness of the second substrate 200, and less than 1.5 times the sum of the thickness of the first substrate 100 and the thickness of the second substrate 200. For another example, the first separation distance S1 may be substantially equal to the sum of the thickness of the first substrate 100 and the thickness of the second substrate 200.

Since the second separation distance S2 exists between the first substrate 100 and the second substrate 200, the first surface 31 of the first conductive pad 3 and the second surface 71 of the second conductive pad 7 are not located in the same horizontal plane, and a height difference exists between the first surface 31 and the second surface 71. In the example of FIG. 6C, the first surface 31 is higher than the second surface 71, and the height difference between the first surface 31 and the second surface 71 is equal to the second separation distance S2. It should be noted that the second separation distance S2 here is mainly caused by a thickness difference between the first base substrate 1 and the second base substrate 6. For example, the second separation distance S2 here may be within a range of 0 to 2 millimeters, such as about 1 millimeter.

Figure 6D:
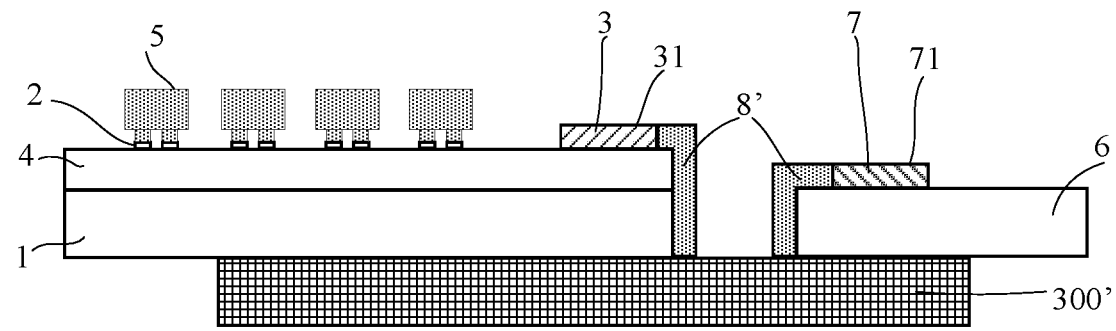

In step S204, continuing to refer to FIG. 6C and FIG. 6D, a first protective adhesive layer 8' is formed so that the first protective adhesive layer 8' covers at least a first sidewall 101 of the first substrate 100 adjacent to the first conductive pad 3 and a second sidewall 201 of the second substrate 200 adjacent to the second conductive pad 7.

Further, the first protective adhesive layer 8' further covers and is in direct contact with an edge portion 102 of the first substrate 100 located between the first conductive pad 3 and the first sidewall 101, and covers and is in direct contact with an edge portion 202 of the second substrate 200 located between the second conductive pad 7 and the second sidewall 201.

For example, each of the first conductive pad 3, the edge portion 102, the first sidewall 101, the second conductive pad 7, the edge portion 202 and the second sidewall 201 may be coated with a certain thickness of protective adhesive. Then, the part of the protective adhesive covering the first conductive pad 3 and the second conductive pad 7 may be removed by laser ablation or film removal, so as not to affect the subsequent process.

For example, a thickness of the first protective adhesive layer 8' is within a range of 5 microns to 500 microns, and the specific value is the same as the thickness of the first conductive pad 3 and/or the thickness of the second conductive pad 7. A material of the first protective adhesive layer 8' may have a Young's modulus within a range of 0.1 Mpa to 80 Gpa. For example, the material of the first protective adhesive layer 8' may be silica gel or polydimethylsiloxane (PDMS).

Optionally, step S204 may be specifically performed according to following steps.

Figure 7A:
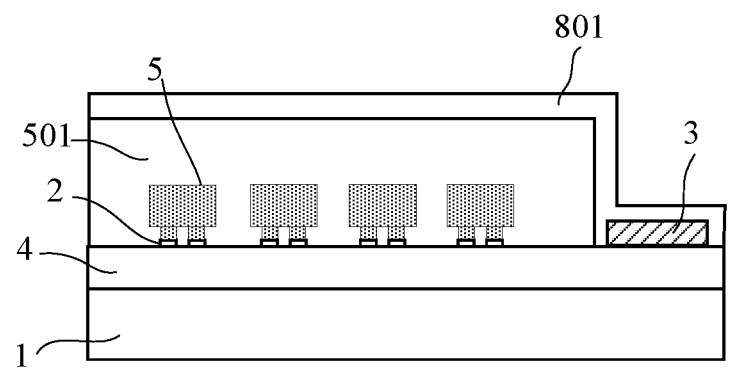
FIG. 7A to FIG. 7D schematically show cross-sectional views of structures formed after one step in a method of manufacturing a light-emitting substrate is performed.

In step S2041, referring to FIG. 7A, a protective film 801 is formed on the first substrate 100. The protective film 801 may cover the entire surface of the first substrate 100, that is, an orthographic projection of the protective film 801 on the first base substrate 1 covers an orthographic projection of the plurality of light-emitting diodes on the first base substrate 1 and further covers an orthographic projection of the plurality of first conductive pads 3 on the first base substrate 1. For example, a thickness of the protective film 801 may be within a range of 1 micron to 100 microns.

It should be noted that an encapsulation layer 501 may be provided on a side of the light-emitting diode 5 away from the first base substrate 1, as shown in FIG. 7A.

In step S2042, a first protective adhesive layer 8" is formed on the first substrate 100. The first protective adhesive layer 8" covers at least the first sidewall 101 of the first substrate 100 adjacent to the first conductive pad 3.

Figure 7B:
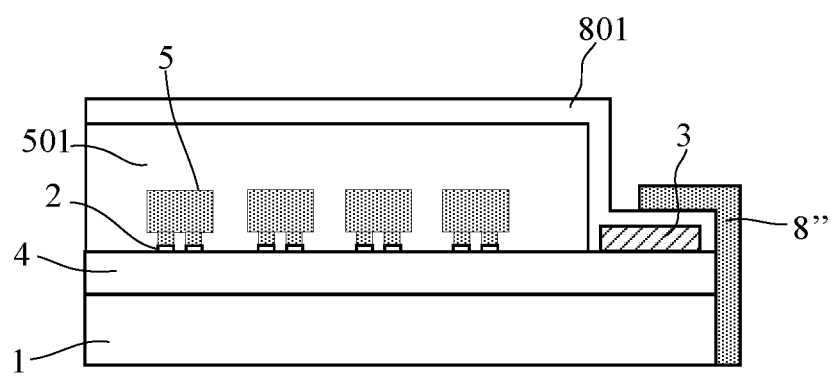
Figure 7C:
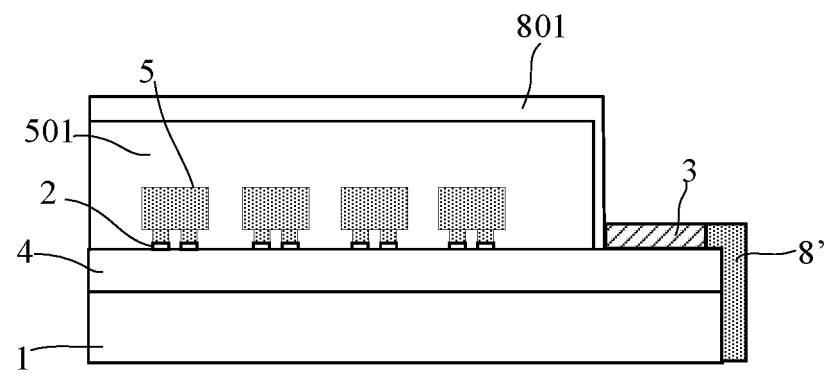

Referring to FIG. 7B, an orthographic projection of the first protective adhesive layer 8" on the first base substrate 1 at least partially overlaps the orthographic projection of the first conductive pad 3 on the first base substrate 1. That is, the orthographic projection of the first protective adhesive layer 8" on the first base substrate 1 at least partially overlaps the orthographic projection of the protective film 801 on the first base substrate 1. In other words, the first protective adhesive layer 8" covers a part of the protective film 801.

In step S2043, at least a part of the protective film 801 is removed to expose the first conductive pad 3.

For example, the part of the protective film 801 covering the first conductive pad 3 may be removed by using laser cutting and laser lift-off (such as LLO process). In this way, an overlapping portion of the first protective adhesive layer 8" and the protective film 801 may be removed at the same time, so that the first conductive pad 3 may be exposed. Alternatively, the part of the first protective adhesive layer 8" and the part of the protective film 801 covering the first conductive pad 3 may be simultaneously removed by using the laser ablation, which may also achieve the purpose of exposing the first conductive pad 3.

Figure 7D:
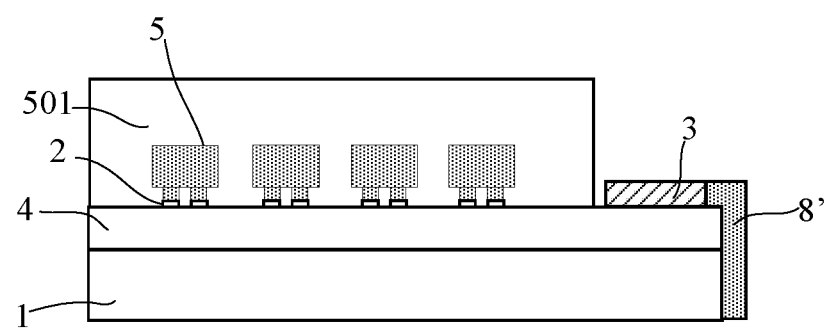

Optionally, in this step S2043, a part of the protective film 801 covering the plurality of light-emitting diodes may be simultaneously removed, as shown in FIG. 7D.

In step S205, the bonding wire 9 is formed so that the bonding wire 9 electrically connects the first conductive pad 3 and the second conductive pad 7.

Figure 6E:
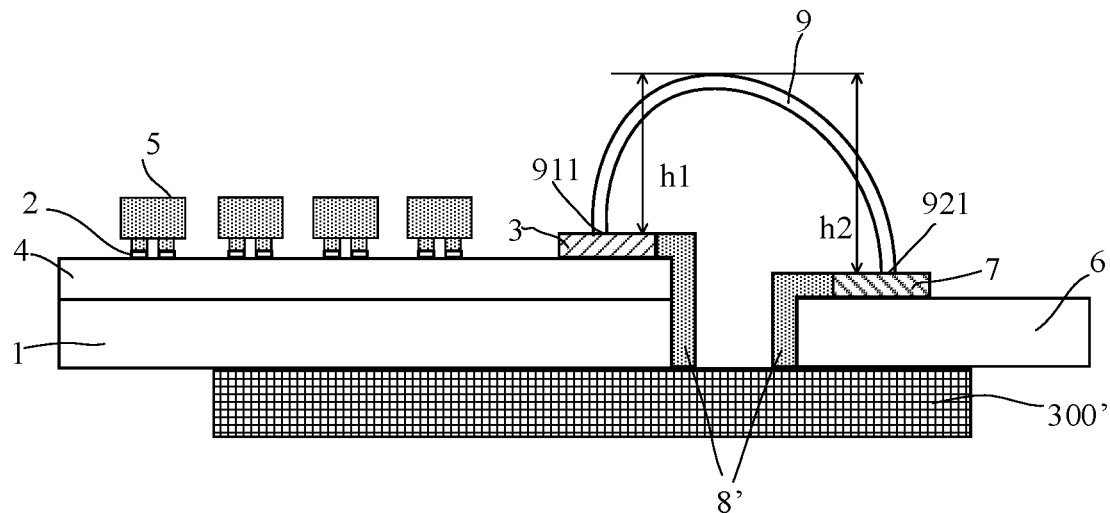

Referring to FIG. 6E, the bonding wire 9 is formed so that an end 91 of the bonding wire 9 is connected to the first conductive pad 3 and another end 92 of the bonding wire 9 is connected to the second conductive pad 7. That is, the end 91 of the bonding wire 9 is soldered to the first conductive pad 3, and the another end 92 is soldered to the second conductive pad 7. The solder joint where the end 91 is soldered to the first conductive pad 3 is referred to as a first solder joint 911, and the solder joint where the end 92 is soldered to the second conductive pad 7 is referred to as a second solder joint 921.

In the embodiment shown in FIG. 6E, the bonding wire 9 has a certain arc. Specifically, the bonding wire 9 includes, at each of the first solder joint 911 and the second solder joint 912, a portion that has a certain angle with the plane where the first base substrate is located and/or that has a curved arc. In this way, the processing difficulty may be reduced.

For example, the first solder joint 911 may be a spherical solder joint, that is, an orthographic projection of the first solder joint 911 on the first base substrate 1 may be circular or approximately circular. In this case, due to a thermal effect of the soldering process, the bonding wire 9 extending from the first solder joint 911 includes a portion having a certain angle with the plane where the first base substrate is located and/or having a curved arc, as shown in FIG. 6E. In some exemplary embodiments, a distance h1 and/or h2 between this portion and the plane where the first base substrate is located is greater than 100 microns, for example, within a range of 100 microns to 500 microns.

For example, the bonding wire 9 may be made of a metal such as Cu, Al, Au, Ag, or alloys thereof.

Referring to FIG. 1 and FIG. 6E in combination, each bonding wire 9 is electrically connected to a first conductive pad 3 and a second conductive pad 7 corresponding to the first conductive pad 3. Since the plurality of first conductive pads 3 are arranged at equal intervals in the first direction X, the plurality of bonding wires 9 are also arranged at equal intervals in the first direction X.

For example, the diameter of the bonding wire 9 may be within a range of 10 microns to 500 microns. When the first solder joint 911 is a wedge-shaped solder joint, the dimension L1 described above is about 2 to 5 times the diameter of the bonding wire.

It should be understood that the arrangement period of the plurality of first conductive pads 3 is related to the diameter of the bonding wire 9 and is further related to a wiring design on the first substrate 100.

Figure 6F:
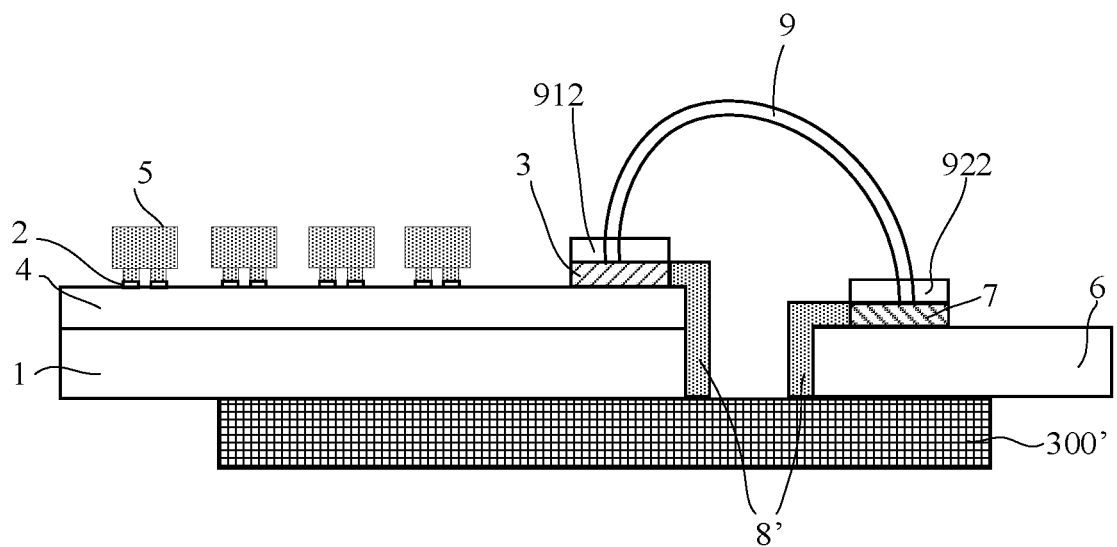

In step S206, referring to FIG. 6F, adhesive dispensing is performed on an area where the first solder joint 911 is located and an area where the second solder joint 921 is located.

For example, a protective adhesive may be applied to an area where the first solder joint 911 is located and an area where the second solder joint 921 is located, so as to form a first solder joint protective adhesive 912 in the area where the first solder joint 911 is located and form a second solder joint protective adhesive 922 in the area where the second solder joint 921 is located. An orthographic projection of the first solder joint protective adhesive 912 on the first substrate 100 covers the orthographic projection of the first solder joint 911 on the first substrate 100, and an orthographic projection of the second solder joint protective adhesive 922 on the second substrate 200 covers the orthographic projection of the second solder joint 921 on the second substrate

200. In this way, the first solder joint and the second solder joint may be protected. For example, the first solder joint protective adhesive 912 and the second solder joint protective adhesive 922 are viscous and insulating adhesives to better protect the first solder joint and the second solder joint.

In step S207, a gum 12 is attached to any one of a surface of the first base substrate 1 away from the first conductive pad 3 and a surface of the second base substrate 6 away from the second conductive pad 7. For example, referring to FIG. 6G, the gum 12 is attached to the surface of the first base substrate 1 away from the first conductive pad 3.

Figure 6G:
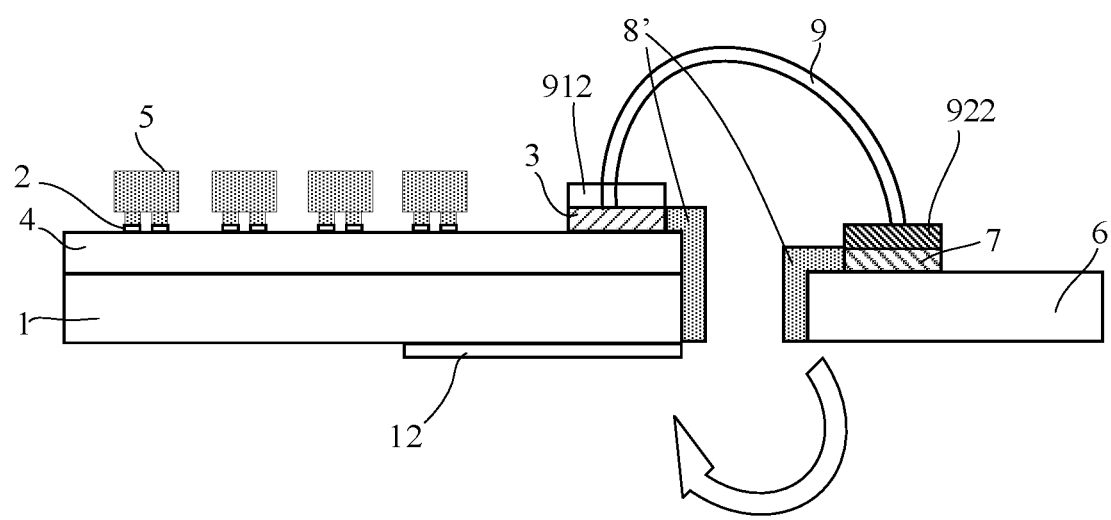
Figure 6H:
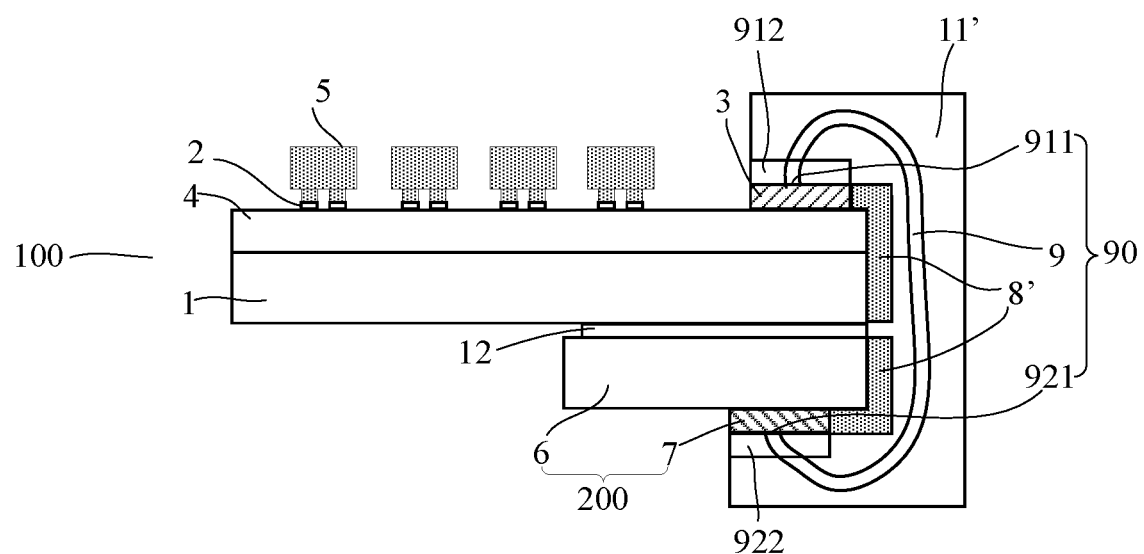

In step S208, referring to FIG. 6G and FIG. 6H in combination, the second substrate 200 is turned toward the first substrate 100 so that the surface of the second base substrate 6 away from the second conductive pad 7 is attached to the gum 12.

In this way, the second substrate 200 may be bent to a rear surface of the first substrate 100, and the two substrates 100 and 200 may be attached together by the gum 12.

For example, in a process of turning the second substrate 200, the second substrate 200 may be rotated to a lower surface of the first substrate 100 by the carrier 300 with a fixed rotation track, so as to ensure the stability of the turning process and reduce risk of breakage of the bonding wire 9.

Referring to FIG. 6H, after the second substrate 200 is turned over so that the surface of the second base substrate 6 away from the second conductive pad 7 is attached to the gum 12, the first protective adhesive layer 8' does not cover the sidewall of the gum 12.

As described above, the first separation distance S1 between the two substrates is greater than the sum of the thickness of the first substrate 100 and the thickness of the second substrate 200. Accordingly, a length of the formed bonding wire 9 is greater than the sum of the thickness of the first substrate 100 and the thickness of the second substrate 200. In this way, during the process of turning over the second substrate 200, it may be ensured that the bonding wire 9 may not be broken, thereby reducing the risk of breakage of the bonding wire 9.

In step S209, referring to FIG. 6H, a second protective adhesive layer 11' is formed so that the second protective adhesive layer 11' covers the first conductive pad 3, the bonding wire 9 and the second conductive pad 7.

Further, the second protective adhesive layer 11' further covers the sidewall of the first substrate 100, the sidewall of the gum 12 and the sidewall of the second substrate 200.

For example, a thickness of the second protective adhesive layer 11' is within a range of 5 microns to 500 microns, and a material of the second protective adhesive layer 11' may have a Young's modulus within a range of 0.1 Mpa to 80 Gpa. For example, the material of the second protective adhesive layer 11' may be silica gel or polydimethylsiloxane (PDMS).

Optionally, the part of the protective film 801 covering the plurality of light-emitting diodes may not be removed in above-mentioned step S2043, and may be removed after step 209 is performed. In this way, the light-emitting diodes may be protected during the manufacturing process.

For example, in step S209, limited by the accuracy control of the adhesive dispensing process, excess protective adhesive may be applied in an area where the light-emitting diode is located. The excess protective adhesive may be removed while removing the part of the protective film 801 covering the plurality of light-emitting diodes after step S209 is performed, so as to realize the overall peeling of the protective film and the excess protective adhesive thereon.

In the method of manufacturing the light-emitting substrate according to the embodiments of the present disclosure, the bonding wire is fabricated by using a wire bonding process, and the substrate is turned over to achieve a stacked structure of the upper and lower substrates, so that the process complexity may be reduced, and manufacturing costs may be reduced.

Some exemplary embodiments of the present disclosure further provide a light-emitting substrate. For example, referring to FIG. 3H and FIG. 6H, the light-emitting substrate may include a first substrate 100, a second substrate 200 and a gum 12 that are stacked. The gum 12 is arranged between the first substrate 100 and the second substrate 200 so as to attach the first substrate 100 and the second substrate 200 together.

The first substrate 100 may include: a first base substrate 1; a plurality of light-emitting diodes arranged on the first base substrate 1; and at least one first conductive pad 3 arranged on the first base substrate 1. The first conductive pad 3 is located on a surface of the first substrate 100 away from the second substrate 200.

The second substrate 200 may include: a second base substrate 6; and at least one second conductive pad 7 arranged on the second base substrate 6. The second conductive pad 7 is located on a surface of the second substrate 200 away from the first substrate 100.

The light-emitting substrate may further include at least one bonding wire structure 90 that electrically connects the first conductive pad 3 and the second conductive pad 7.

Each bonding wire structure 90 may include a bonding wire 9, a first solder joint 911 and a second solder joint 921. An end of the bonding wire 9 is soldered to the first conductive pad 3 at the first solder joint 911, and another end of the bonding wire 9 is soldered to the second conductive pad 7 at the second solder joint 921.

Referring to FIG. 3H, the light-emitting substrate may further include a first protective adhesive layer 8 in contact with at least the first sidewall 101 of the first substrate 100 and the second sidewall 201 of the second substrate 200. The first sidewall 101 is a sidewall of the first substrate 100 adjacent to the first conductive pad 3. The second sidewall 201 is a sidewall of the second substrate 200 adjacent to the second conductive pad 7.

Continuing to refer to FIG. 3H, the first protective adhesive layer 8 is further in contact with the sidewall of the gum 12. The orthographic projection of the sidewall of the gum 12 on the first substrate 100, the orthographic projection of the first sidewall 101 on the first substrate 100 and the orthographic projection of the second sidewall 201 on the first substrate 100 coincide with each other.

The light-emitting substrate may further include a second protective adhesive layer 11. The bonding wire 9 is sandwiched between the first protective adhesive layer 8 and the second protective adhesive layer 11.

Continuing to refer to FIG. 3H, the projection of the second protective adhesive layer 11 in the direction perpendicular to the first sidewall 101 covers the projection of the bonding wire 9 in the direction perpendicular to the first sidewall 101. In addition, the orthographic projection of the second protective adhesive layer 11 on the first base substrate 1 covers each of the orthographic projection of the first conductive pad 3 on the first base substrate 1 and the orthographic projection of the second conductive pad 7 on the first base substrate 1. In this way, the second protective adhesive layer 11 may protect the bonding wire, the solder joints, and the conductive pads.

The surface of the first protective adhesive layer 8 away from the first sidewall 101 is in contact with the bonding wire 9, and the surface of the second protective adhesive layer 11 close to the first sidewall 101 is in contact with the bonding wire 9. In this way, the bonding wire 9 is sandwiched between the first protective adhesive layer 8 and the second protective adhesive layer 11, so as to obtain a better protection.

For example, a dimension (that is, a thickness) of the second protective adhesive layer 11 in the direction perpendicular to the first sidewall 101 is equal to a dimension (that is, a thickness) of the first protective adhesive layer 8 in the direction perpendicular to the first sidewall 101.

Referring to FIG. 6H, the bonding wire 9 has a certain arc at each of the first solder joint 911 and the second solder joint 921.

The light-emitting substrate may further include a first protective adhesive layer 8' in contact with at least the first sidewall 101 of the first substrate 100 and the second sidewall 201 of the second substrate 200. The first protective adhesive layer 8' is not in contact with the sidewall of the gum 12. That is, the projection of the first protective adhesive layer 8' in the direction perpendicular to the first sidewall 101 does not overlap the projection of the gum 12 in the direction perpendicular to the first sidewall 101.

The light-emitting substrate may further include a first solder joint protective adhesive 912 and a second solder joint protective adhesive 922. An orthographic projection of the first solder joint protective adhesive 912 on the first base substrate 1 covers at least the orthographic projection of the first solder joint 911 on the first base substrate 1, and an orthographic projection of the second solder joint protective adhesive 922 on the first base substrate 1 covers at least the orthographic projection of the second solder joint 921 on the first base substrate 1. Optionally, the orthographic projection of the first solder joint protective adhesive 912 on the first base substrate 1 covers the orthographic projection of the first conductive pad 3 on the first base substrate 1, and the orthographic projection of the second solder joint protective adhesive 922 on the first base substrate 1 covers the orthographic projection of the second conductive pad 7 on the first base substrate 1.

The light-emitting substrate may further include a second protective adhesive layer 11'. The second protective adhesive layer 11' covers at least the first conductive pad 3, the bonding wire 9 and the second conductive pad 7. That is, an orthographic projection of the second protective adhesive layer 11' on the first base substrate 1 covers each of the orthographic projection of the first conductive pad 3 on the first base substrate 1 and the orthographic projection of the second conductive pad 7 on the first base substrate 1, the orthographic projection of the second protective adhesive layer 11' on the first base substrate 1 covers the orthographic projection of the bonding wire 9 on the first base substrate 1, and a projection of the second protective adhesive layer 11' in the direction perpendicular to the first sidewall 101 covers the projection of the bonding wire 9 in the direction perpendicular to the first sidewall 101.

Further, the second protective adhesive layer 11' further covers the first sidewall 101 of the first substrate 100, the sidewall of the gum 12, and the second sidewall 201 of the second substrate 200. That is, the projection of the first protective adhesive layer 11' in the direction perpendicular to the first sidewall 101 covers each of the first sidewall 101, the sidewall of the gum 12, and the second sidewall 201.

For example, in the embodiments of the present disclosure, each of the first protective adhesive layer, the second protective adhesive layer and the solder joint protective adhesive layer is made of an insulating adhesive material.

For example, the second protective adhesive layer may be made of a black adhesive material, so as to prevent light reflected by the conductive pad and the bonding wire from interfering with light used for display. Optionally, the second protective adhesive layer may be made of a non-black adhesive material. In this case, the entire surface of the module may be blackened.

The first substrate 100 may be a backplane for a light-emitting diode display panel. The first substrate 100 may include but not be limited to a passive driving backplane, or an active driving backplane including thin film transistors, or an active driving backplane driven by a micro IC.

Hereinafter, the first substrate 100 will be illustrated with a specific example. However, the following specific example may not be regarded as a limitation to the embodiments of the present disclosure. The backplane according to the embodiments of the present disclosure may include driving backplanes of various types and various structures known in the art.

Figure 9:
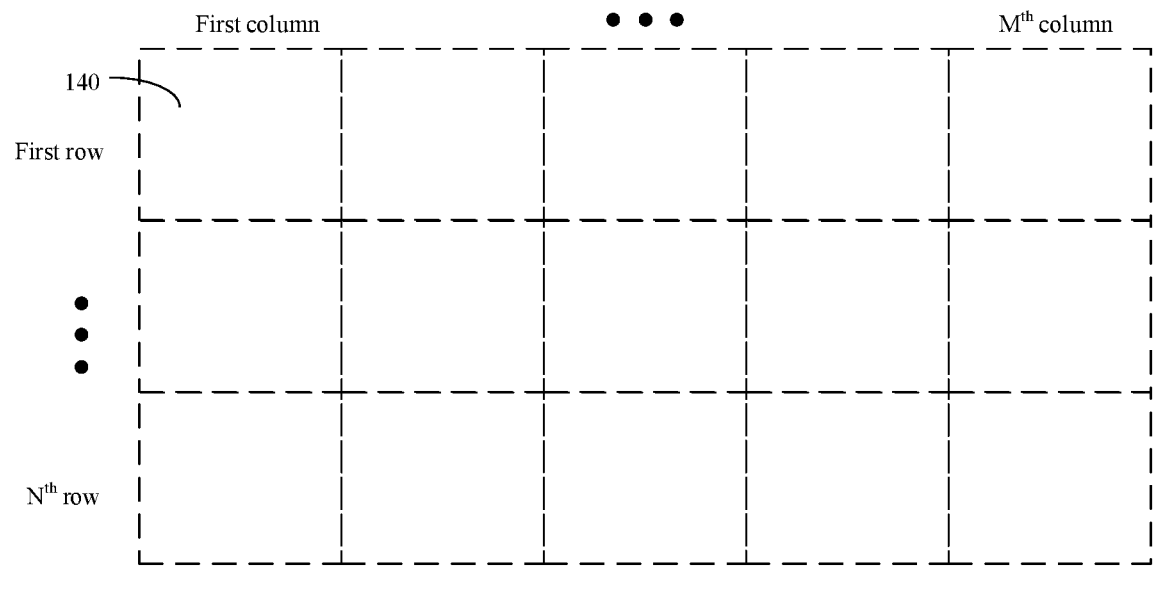
FIG. 9 shows a schematic diagram of an arrangement of light-emitting units of a light-emitting substrate shown in FIG. 1.
Figure 10:
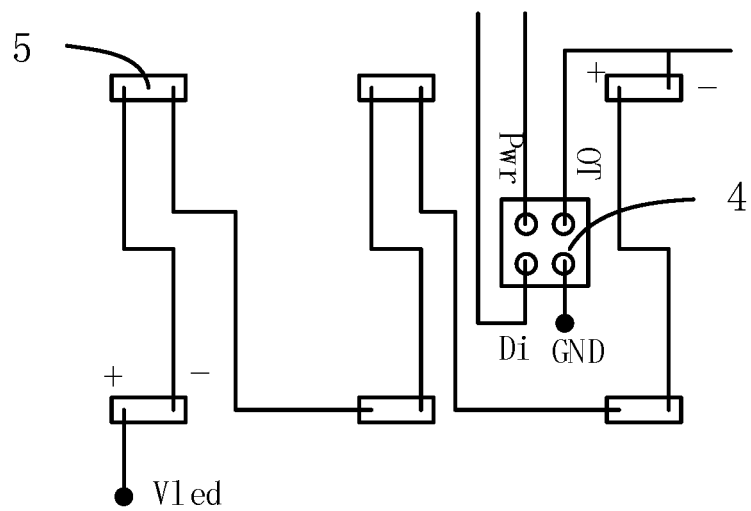
FIG. 10 shows a schematic diagram of a light-emitting unit in the light-emitting substrate shown in FIGS. 9.

FIG. 9 shows a schematic diagram of an arrangement of the light-emitting units of the light-emitting substrate shown in FIG. 1. FIG. 10 shows a schematic diagram of a light-emitting unit in the light-emitting substrate shown in FIG. 9. As shown in FIG. 1, FIG. 9 and FIG. 10, the first substrate 100 may include a first base substrate 1 and a plurality of light-emitting units 140 arranged in an array on the first base substrate 1. For example, the plurality of light-emitting units 140 are arranged in N rows and M columns, where N is an integer greater than 0, and M is an integer greater than 0. For example, the number of the light-emitting units 140 may be determined according to actual needs, such as the dimension of the light-emitting substrate and the desired brightness. Although only three rows and five columns of light-emitting units 140 are shown in FIG. 9, it should be understood that the number of the light-emitting units 140 is not limited to this.

For example, each row of light-emitting units 140 is arranged in the first direction X, and each column of light-emitting units 140 is arranged in the second direction Y.

Each light-emitting unit 140 includes a driving circuit 4, a plurality of light-emitting diodes 5, and a driving voltage terminal Vled.

The driving circuit 4 may include a first input terminal Di, a second input terminal Pwr, an output terminal OT, and a common voltage terminal GND. The first input terminal Di may receive a first input signal, and the first input signal may be, for example, an address signal used to select the driving circuit 4 of the corresponding address. For example, different driving circuits 4 may have a same address or different addresses. The first input signal may be an 8-bit address signal, and an address to be transmitted may be known by parsing the address signal. The second input terminal Pwr may receive a second input signal, and the second input signal may be, for example, a power line carrier communication signal. For example, the second input signal not only provides power to the driving circuit 4, but also transmits communication data to the driving circuit 4. The communication data may be used to control a light emission duration of the corresponding light-emitting unit 140, so as to controlling a visual brightness of the light-emitting unit 140. The output terminal OT may output different signals in different time periods, for example, respectively output a relay signal and a driving signal. For example, the relay signal is an address signal provided to other driving circuit 4, that is, the first input terminal Di of the other drive circuit 4 may receive the relay signal as a first input signal, so as to acquire the address signal. For example, the driving signal may be a driving current used to drive the light-emitting diode 5 to emit light. The common voltage terminal GND may receive a common voltage signal, such as a ground signal.

The driving circuit 4 is used to output a relay signal through the output terminal OT in a first time period according to the first input signal received by the first input terminal Di and the second input signal received by the second input terminal Pwr, and to provide, through the output terminal OT, the driving signals to the plurality of light-emitting diodes 5 connected in series in the second time period. In the first time period, the output terminal OT may output a relay signal, and the relay signal is then provided to other driving circuits 4 so that the other driving circuits 4 may acquire the address signal. In the second time period, the output terminal OT may output a driving signal, and the driving signal is then provided to the plurality of light-emitting diodes 5 connected in series, so that the light-emitting diodes 5 may emit light in the second time period. For example, the first time period and the second time period are different periods, and the first time period may be, for example, earlier than the second time period. The first time period may be continuously connected to the second time period, and an end time of the first time period is a start time of the second time period. Alternatively, there may be other time periods between the first time period and the second time period. The other time periods may be used to implement other desired functions. The other time periods may also be used only to separate the first time period and the second time period to prevent the signal at the output terminal OT in the first time period and the signal at the output terminal OT in the second time period from interfering with each other.

For example, as shown in FIG. 10, the plurality of light-emitting diodes 5 are connected in series between the driving voltage terminal Vled and the output terminal OT. For example, each light-emitting diode 5 includes a positive electrode (+) and a negative electrode (−) (or may be referred to as an anode electrode and a cathode electrode, or a P electrode and an N electrode), and the positive electrodes of the plurality of light-emitting diodes 5 and the negative electrodes of the plurality of light-emitting diodes 5 are connected in series end to end, so as to form a current path between the driving voltage terminal Vled and the output terminal OT. The driving voltage terminal Vled may provide a driving voltage, and the driving voltage may be, for example, a high voltage in a time period (the second time period) in which the light-emitting diode 5 needs to emit light, and the driving voltage may be a low voltage in other time periods. Therefore, in the second time period, the driving signal (for example, the driving current) may flow from the driving voltage terminal Vled sequentially through the plurality of light-emitting diodes 5 and then into the output terminal OT of the driving circuit 4. The plurality of light-emitting diodes 5 may emit light when the driving current flows. By controlling the duration of the driving current, the light emission duration of the light-emitting diodes 5 may be controlled, so that the visual brightness may be controlled.

It should be noted that in the embodiments of the present disclosure, the number of the light-emitting diodes 5 in each light-emitting unit 140 is not limited, which may be any number such as 4, 5, 7, 8, etc., and which is not limited to 6. The plurality of light-emitting diodes 5 may be arranged in any manner, for example, arranged in a desired pattern, and is not limited to a matrix arrangement. A placement position of the driving circuit 4 is not limited, and the driving circuit 4 may be placed in any gap between the light-emitting diodes 5, which may be determined according to actual desires and not limited in the embodiments of the present disclosure.

For example, referring back to FIG. 1, the driving circuit 4 in each light-emitting unit 140 may be led to the first conductive pad 3 located in the fan-out area through the signal line 150, and then led to an external driving circuit through the bonding wire 9 and the second conductive pad 7.

For example, the driving circuit 4 may include a thin film transistor array layer. The thin film transistor array layer may specifically include an active layer, a gate insulating layer, a gate electrode, a source electrode, a drain electrode, a planarization layer, and so on. The specific layer structure of the driving circuit 4 may refer to the layer structure applied in the existing array substrate, which will not be repeated here.

Figure 11:
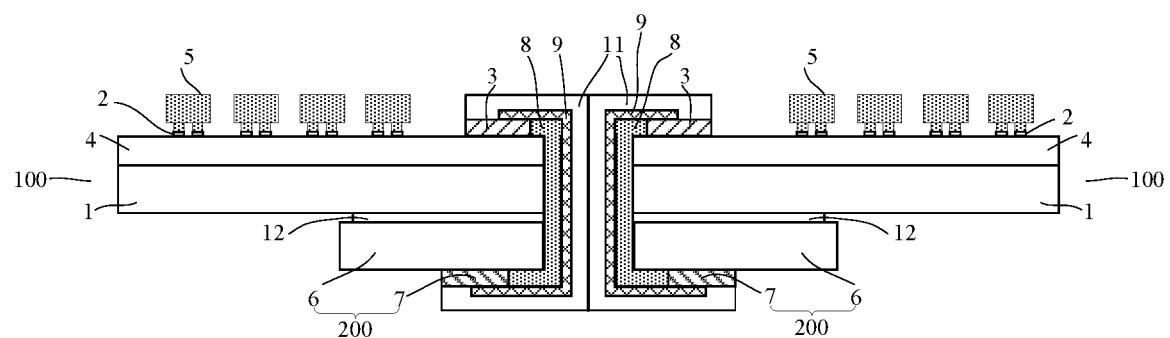
FIG. 11 and FIG. 12 show schematic diagrams of a display device according to some exemplary embodiments of the present disclosure, respectively.
Figure 12:
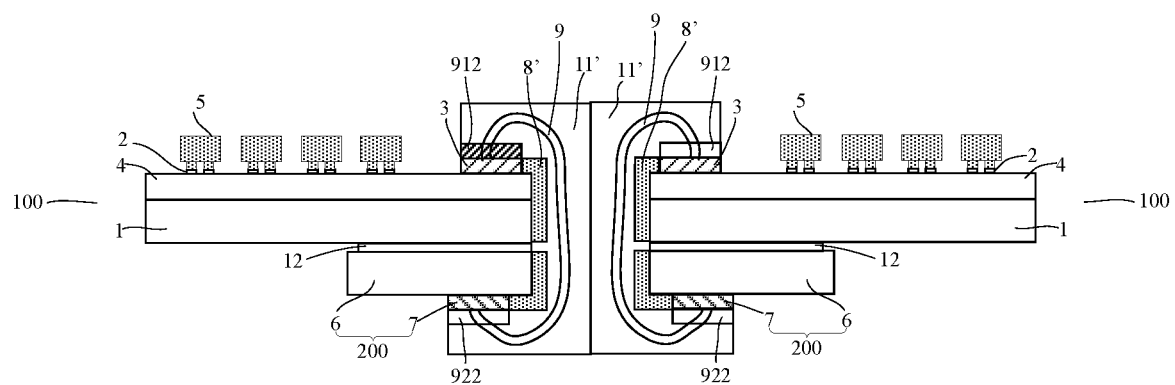

Some exemplary embodiments of the present disclosure further provide a display device. FIG. 11 and FIG. 12 show schematic diagrams of a display device according to some exemplary embodiments of the present disclosure. Referring to FIG. 11 and FIG. 12, the display device includes at least two light-emitting substrates as described above. At least two light-emitting substrates as described above may be spliced to form a display device.

Figure 8:
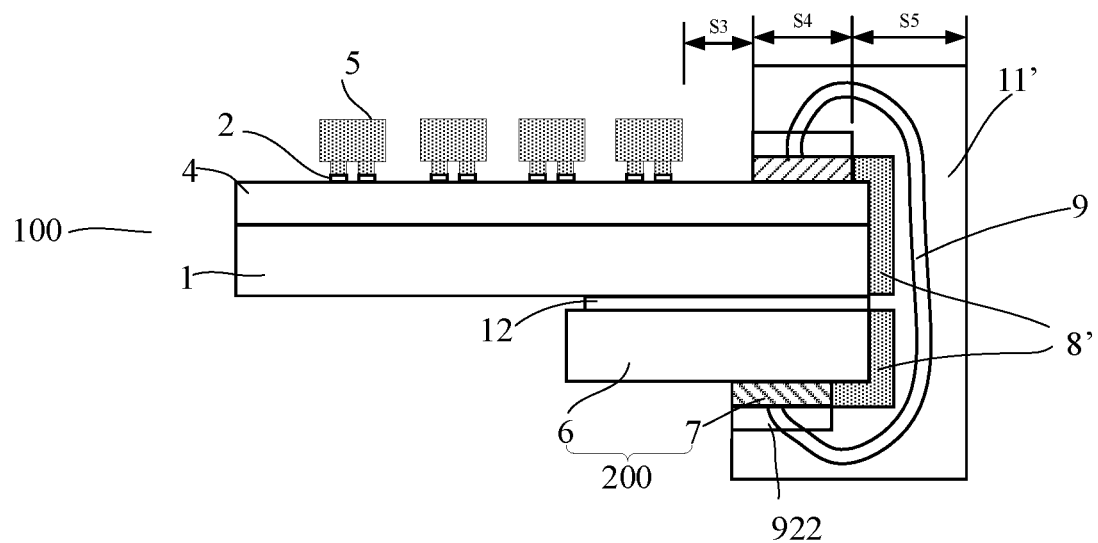
FIG. 8 schematically shows a schematic diagram of a frame area of a light-emitting substrate according to some embodiments of the present disclosure.

FIG. 8 schematically shows a schematic diagram of a frame area of the light-emitting substrate according to some embodiments of the present disclosure. With reference to FIG. 8, FIG. 11 and FIG. 12, S3 indicates a width of an edge area of a light-emitting diode bonding area and a silicone encapsulation, S4 indicates a width of the first conductive pad that may be controlled to be 1.5 to 2.5 times the diameter of the bonding wire 9, and S5 indicates an overall adhesive thickness of the bonding wire adhesive protection, that is, the sum of the thickness of the first protective adhesive layer and the thickness of the second protective adhesive layer. In this way, the width of the frame area of the light-emitting substrate is substantially a sum of S3, S4 and S5, which may be controlled within a range of 0.08 mm to 1.5 mm. Therefore, in the display device of the embodiments of the present disclosure, the splicing area has a width of 2*(S3+S4+S5), that is, the display device may be implemented to have a splicing area width of 0.16 mm to 3 mm. Therefore, the width of the splicing area may be reduced, which is conducive to the realization of a large-size display device.

It should be noted that some steps in the above-mentioned method may be performed separately or in combination, and may be performed in parallel or sequentially, and are not limited to the specific operation sequence shown in the figures.

It should be understood that the display device according to some exemplary embodiments of the present disclosure have all the features and advantages of the light-emitting substrate described above. The features and advantages may be referred to the above description of the light-emitting substrate and will not be repeated here.

As used herein, the terms "substantially", "about", "approximately" and other similar terms are used as terms of approximation rather than as terms of degree, and they are intended to explain the inherent deviation of the measured or calculated value that will be recognized by those ordinary skilled in the art. Taking into account process fluctuation, measurement problems, and errors related to measurement of specific quantities (that is, limitations of a measurement system), the terms "about" or "approximately" used in the present disclosure includes the stated value and means that the specific value determined by those ordinary skilled in the art is within an acceptable range of deviation. For example, "about" may mean within one or more standard deviations, or within ±10% or ±5% of the stated value.

Although some embodiments according to the general inventive concept of the present disclosure have been illustrated and described, it should be understood by those ordinary skilled in the art that these embodiments may be changed without departing from the principle and spirit of the general inventive concept of the present disclosure. The scope of the present disclosure is defined by the claims and their equivalents.

What is claimed is:

1. A light-emitting substrate, comprising:
   a first substrate comprising a first base substrate, a light-emitting diode arranged on the first base substrate, and a first conductive pad arranged on the first base substrate;
   a second substrate arranged opposite to the first substrate, wherein the second substrate comprises a second base substrate, and a second conductive pad arranged on the second base substrate; and
   a bonding wire structure comprising a bonding wire,
   wherein the first conductive pad is located on a surface of the first substrate away from the second substrate, the second conductive pad is located on a surface of the second substrate away from the first substrate, and the bonding wire is configured to electrically connect the first conductive pad and the second conductive pad; and
   wherein the bonding wire structure further comprises a first solder joint and a second solder joint, an end of the bonding wire is soldered to the first conductive pad at the first solder joint, and another end of the bonding wire is soldered to the second conductive pad at the second solder joint.

2. The light-emitting substrate of claim 1, further comprising a gum, wherein the gum is arranged between the first substrate and the second substrate and configured to attach the first substrate and the second substrate together.

3. The light-emitting substrate of claim 2, further comprising a first protective adhesive layer, wherein the first substrate comprises a first sidewall adjacent to the first conductive pad, the second substrate comprises a second sidewall adjacent to the second conductive pad, and the first protective adhesive layer is in contact with at least the first sidewall and the second sidewall.

4. The light-emitting substrate of claim 3, wherein the gum comprises a third sidewall, and an orthographic projection of the first sidewall on the first base substrate, an orthographic projection of the second sidewall on the first base substrate and an orthographic projection of the third sidewall on the first base substrate coincide with each other.

5. The light-emitting substrate of claim 4, wherein the first protective adhesive layer is further in contact with the third sidewall.

6. The light-emitting substrate of claim 4, wherein the bonding wire comprises, at each of the first solder joint and the second solder joint, a portion that has an angle with a plane in which the first base substrate is located and/or that has a curved arc.

7. The light-emitting substrate of claim 6, wherein a projection of the first protective adhesive layer in a direction perpendicular to the first sidewall does not overlap with a projection of the third sidewall in the direction perpendicular to the first sidewall.

8. The light-emitting substrate of claim 6, further comprising a first solder joint protective adhesive provided at the first solder joint and a second solder joint protective adhesive provided at the second solder joint,
   wherein an orthographic projection of the first solder joint protective adhesive on the first base substrate covers at least an orthographic projection of the first solder joint on the first base substrate, and an orthographic projection of the second solder joint protective adhesive on the first base substrate covers at least an orthographic projection of the second solder joint on the first base substrate;
   wherein the orthographic projection of the first solder joint protective adhesive on the first base substrate covers an orthographic projection of the first conductive pad on the first base substrate, and the orthographic projection of the second solder joint protective adhesive on the first base substrate covers an orthographic projection of the second conductive pad on the first base substrate.

9. The light-emitting substrate of claim 6, wherein the bonding wire is located on a side of the first protective adhesive layer away from the first sidewall, and a gap is formed between the first protective adhesive layer and the bonding wire in a direction perpendicular to the first sidewall.

10. The light-emitting substrate of claim 9, further comprising a second protective adhesive layer, wherein the second protective adhesive layer covers the bonding wire and fills the gap between the first protective adhesive layer and the bonding wire.

11. The light-emitting substrate of claim 10, wherein an orthographic projection of the second protective adhesive layer on the first base substrate covers an orthographic projection of the bonding wire on the first base substrate, and a projection of the second protective adhesive layer in the direction perpendicular to the first sidewall covers a projection of the bonding wire in the direction perpendicular to the first sidewall;
   wherein the orthographic projection of the second protective adhesive layer on the first base substrate covers each of an orthographic projection of the first solder joint protective adhesive on the first base substrate and an orthographic projection of the second solder joint protective adhesive on the first base substrate.

12. The light-emitting substrate of claim 3, further comprising a second protective adhesive layer, wherein the bonding wire is sandwiched between the first protective adhesive layer and the second protective adhesive layer.

13. The light-emitting substrate of claim 12, wherein a projection of the second protective adhesive layer in a direction perpendicular to the first sidewall covers a projection of the bonding wire in the direction perpendicular to the first sidewall;
   wherein an orthographic projection of the second protective adhesive layer on the first base substrate covers each of an orthographic projection of the first conductive pad on the first base substrate, an orthographic projection of the first solder joint on the first base substrate, an orthographic projection of the second conductive pad on the first base substrate and an orthographic projection of the second solder joint on the first base substrate.

14. The light-emitting substrate of claim 12, wherein a surface of the first protective adhesive layer away from the first sidewall is in contact with the bonding wire, and a surface of the second protective adhesive layer close to the first sidewall is in contact with the bonding wire.

15. The light-emitting substrate of claim 12, wherein a dimension of the second protective adhesive layer in the direction perpendicular to the first sidewall is equal to a dimension of the first protective adhesive layer in the direction perpendicular to the first sidewall.

16. The light-emitting substrate of claim 15, wherein the dimension of the first protective adhesive layer in the direction perpendicular to the first sidewall is within a range of 5 microns to 500 microns, and/or, a material of each of the first protective adhesive layer and the second protective adhesive layer has a Young's modulus within a range of 0.1 Mpa to 80 Gpa.

17. The light-emitting substrate of claim 12, wherein each of the first protective adhesive layer and the second protective adhesive layer comprises an insulating adhesive material; or
wherein the second protective adhesive layer comprises a black adhesive material.

18. The light-emitting substrate of claim 1, wherein the light-emitting diode is a mini light-emitting diode or a micro light-emitting diode; or
wherein the bonding wire has a diameter within a range of 10 microns to 500 microns; or
wherein the light-emitting substrate comprises a plurality of light-emitting diodes, a plurality of first conductive pads, a plurality of second conductive pads and a plurality of bonding wires, and the plurality of bonding wires are configured to electrically connect the plurality of first conductive pads and the plurality of second conductive pads, respectively.

19. A display device comprising the light-emitting substrate of claim 1.

20. A method of manufacturing a light-emitting substrate, comprising:
providing a first substrate, wherein the first substrate comprises a first base substrate and a first conductive pad provided on the first base substrate;
transferring and bonding a light-emitting diode to the first substrate;
providing a second substrate, wherein the second substrate comprises a second base substrate and a second conductive pad provided on the second based substrate;
placing the first substrate and the second substrate on a carrier so as to maintain a relative position of the first substrate and the second substrate;
forming a bonding wire structure to electrically connect the first conductive pad and the second conductive pad; and
turning the second substrate toward the first substrate, so that a surface of the second base substrate away from the second conductive pad faces the first substrate, that the first conductive pad is located on a surface of the first substrate away from the second substrate, and that the second conductive pad is located on a surface of the second substrate away from the first substrate,
wherein the bonding wire structure comprises a bonding wire configured to electrically connect the first conductive pad and the second conductive pad; and a first solder joint and a second solder joint, wherein an end of the bonding wire is soldered to the first conductive pad at the first solder joint, and another end of the bonding wire is soldered to the second conductive pad at the second solder joint.

21. The method of claim 20, wherein the placing the first substrate and the second substrate on a carrier so as to maintain a relative position of the first substrate and the second substrate comprises:
separating the first substrate and the second substrate by a predetermined distance, so that the first conductive pad and the second conductive pad are separated by a predetermined distance, and that a first surface of the first conductive pad away from the first base substrate and a second surface of the second conductive pad away from the second base substrate are located in a same horizontal plane;
after placing the first substrate and the second substrate on the carrier and before forming the bonding wire structure, the method further comprises: ,
forming a first protective adhesive layer in a gap formed between the first conductive pad and the second conductive pad, so that an orthographic projection of the first protective adhesive layer on the carrier covers an orthographic projection of the gap on the carrier, and that a third surface of the first protective adhesive layer away from the carrier is located in the same horizontal plane as the first surface;
wherein the forming a bonding wire structure comprises:
forming the bonding wire in a plane in which the first conductive pad and the second conductive pad are located.

22. The method of claim 20, after placing the first substrate and the second substrate on the carrier and before forming the bonding wire structure, the method further comprises:,
forming a first protective adhesive layer, so that the first protective adhesive layer covers at least a first sidewall of the first substrate adjacent to the first conductive pad and a second sidewall of the second substrate adjacent to the second conductive pad.

* * * * *